(12) United States Patent
Suzuki

(10) Patent No.: US 10,303,542 B2
(45) Date of Patent: May 28, 2019

(54) SEMICONDUCTOR DEVICE, FUNCTIONAL SAFETY SYSTEM AND PROGRAM

(71) Applicant: Renesas Electronics Corporation, Tokyo (JP)

(72) Inventor: Shinichi Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 57 days.

(21) Appl. No.: 15/375,644

(22) Filed: Dec. 12, 2016

(65) Prior Publication Data
US 2017/0168889 A1 Jun. 15, 2017

(30) Foreign Application Priority Data
Dec. 14, 2015 (JP) .................................. 2015-242780

(51) Int. Cl.
*G06F 11/10* (2006.01)
*H03M 13/09* (2006.01)

(52) U.S. Cl.
CPC .......... *G06F 11/10* (2013.01); *G06F 11/1012* (2013.01); *H03M 13/095* (2013.01)

(58) Field of Classification Search
CPC ............................ G06F 11/10; H03M 13/095
See application file for complete search history.

(56) References Cited

U.S. PATENT DOCUMENTS

| | | | |
|---|---|---|---|
| 8,631,274 B2* | 1/2014 | Frost | G06F 11/1044 714/6.24 |
| 2015/0220387 A1* | 8/2015 | Kwok | G06F 12/00 714/764 |
| 2017/0262379 A1* | 9/2017 | Hara | G06F 12/1009 |

FOREIGN PATENT DOCUMENTS

| | | |
|---|---|---|
| JP | 2013-109532 A | 6/2013 |
| JP | 2012-104064 A | 5/2015 |
| WO | WO 2012053882 A1 * | 4/2012 ............. G06F 21/72 |

OTHER PUBLICATIONS

S. Li, C. Xu, Q. Zou, J. Zhao, Y. Lu and Y. Xie, "Pinatubo: A processing-in-memory architecture for bulk bitwise operations in emerging non-volatile memories," 2016 53nd ACM/EDAC/IEEE Design Automation Conference (DAC), Austin, TX, 2016, pp. 1-6.*

* cited by examiner

*Primary Examiner* — Cynthia Britt
(74) *Attorney, Agent, or Firm* — McDermott Will & Emery LLP

(57) ABSTRACT

A semiconductor device includes a bitwise operation unit and a storage control unit. The bitwise operation unit performs a bitwise operation on first n-bit (n is an integer) data that is storage object data and second data of an n-bit bit pattern and generates third data of a bit pattern that the number of "1s" and the number of "0s" are almost the same as each other. The storage control unit stores the third data into a first storage destination of a storage unit and stores fourth data that is the third data or data that is converted into the third data by performing a bitwise operation that has been predetermined in advance on the data into a second storage destination of the storage unit.

12 Claims, 17 Drawing Sheets

SEMICONDUCTOR DEVICE, FUNCTIONAL SAFETY SYSTEM AND PROGRAM

CROSS-REFERENCE TO RELATED APPLICATIONS

The disclosure of Japanese Patent Application No. 2015-242780 filed on Dec. 14, 2015 including the specification, drawings and abstract is incorporated herein by reference in its entirety.

BACKGROUND

The present invention relates to a semiconductor device, a functional safety system and a program and, in particular, relates to, the semiconductor device, the functional safety system and the program configured to perform, for example, data storage.

In recent years, in functional safety of industrial equipment, automobile products and so forth, a soft error (temporary data content corruption) that would occur in a memory, a flip flop and so forth caused by alpha rays, neutron rays and so forth has become an issue.

Detection by using test data, detection by using a double RAM (Random Access Memory) algorithm and detection by using an ECC (Error Check and Correct) function are given as methods of detecting the soft error of the memory in Japanese Unexamined Patent Application Publication No. 2012-104064. Here, in the detection by using the test data, when predetermined test data is written into the RAM concerned and thereafter read-out data does not match the original test data, an operation of detecting the above-mentioned situation as the soft error is periodically repeated. In the detection by using the double RAM algorithm, in actual data accessing, actual data is written into a designated address and data of the form that all bits of the actual data have been inverted is written into an address of the form that the designated address has been inverted. Then, when the read-out actual data is compared with the inverted data and the actual data does not match the inverted data, this situation is detected as the soft error. In addition, the detection by using the ECC function is detection of the soft error by using an ECC function that is attached to a RAM module.

However, in the detection by using the test data, since data is read out shortly after the data has been written and it is confirmed whether the read-out data matches the original data, a probability of collision of radioactive rays (including secondary cosmic rays) is low and acquisition of a sufficient soft error detection rate is not expected. In addition, time is taken for saving and restoring the actual data in the memory and for detecting the soft error and therefore performance degradation of the system is induced. In addition, the detection by using the ECC function has such disadvantages that it is difficult to adopt the detection using the ECC function for a RAM that has no ECC function as hardware, a processing load is high in software and therefore implementation of the software is difficult.

In addition, Japanese Unexamined Patent Application Publication No. 2013-109532 discloses that in data writing, predetermined data is written into data areas in three different formats in order to perform soft error detection and data recovery. Here, the first data is raw data (writing object data), the second data is inverted data of the writing object data, and the third data is data obtained by performing a bitwise operation on the writing object data and predetermined data.

SUMMARY

As described above, the detection by using the test data and the detection by using the ECC function are not necessarily suited for soft error detection. However, also in the detection by using the double RAM algorithm, there are such disadvantages as follows. Since the test data is not used and the actual data is used in detection of the soft error, there is a deviation in data content. That is, the content of the data deviates to "0s" or "1s". Therefore, a soft error detection rate of data whose content is stored as a fixed value of "0s" and a soft error detection rate of data whose content is stored as a fixed value of "1s" become unbalanced.

In addition, although in data storage disclosed in Japanese Unexamined Patent Application Publication No. 2013-109532, the data obtained by performing the bitwise operation on the writing object data and the predetermined data is used as the third data as described above, the deviation still remains in this data. Therefore, the disadvantage that the error data detection rates become unbalanced still remains to be eliminated.

Accordingly, it is requested to make the soft error detection rate of the data whose content is stored as the fixed value of "0s" equal to the soft error detection rate of the data whose content is stored as the fixed value of "1s" in detection of the soft error using the actual data.

Other subject matters and novel features of the present invention will become apparent from, the description in the present specification and the appended drawings.

According to one embodiment of the present invention, there is provided a semiconductor device that includes an bitwise operation unit that generates data of a bit pattern that the number of "1s" and the number of "0s" are almost the same as each other from storage object data and a storage control unit that stores the generated data into a first storage destination, and stores the generated data or data that is converted into the generated data by performing a bitwise operation that has been determined in advance on the data into a second storage destination.

According to the above-mentioned one embodiment, in detection of the soft error using the actual data, it is possible to suppress unbalance between the soft error detection rate of the data whose content is stored as the fixed value of "0s" and the soft error detection rate of the data whose content is stored as the fixed value of "1s".

DETAILED DESCRIPTION

Figure 1:
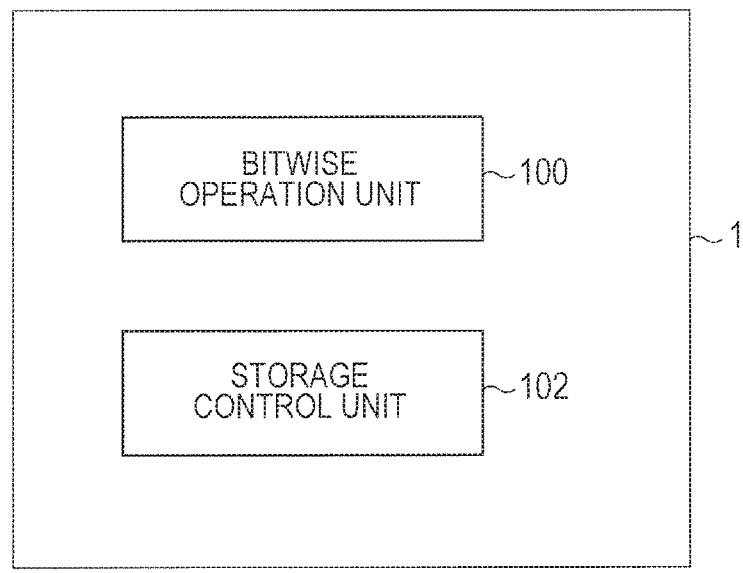
FIG. 1 is a block diagram illustrating one schematic configurational example of a semiconductor device according to a first embodiment.

In the following description and the drawings, omission and simplification are appropriately made for clarification of the description. In addition, it is possible to configure respective elements illustrated in the drawings as functional blocks for performing various processes by a CPU, a memory and other circuits in hardware and to implement the respective elements by a program and so forth that are loaded on the memory in software. Accordingly, a person skilled in the art would understand that it is possible to implement these functional blocks in a variety of forms only by hardware, only by software and/or by a combination of hardware and software, and the functional blocks are not limited to any one of them. Incidentally, in each drawing, the same numerals are assigned to the same elements and redundant and repetitive description is omitted as demanded.

In addition, it is possible to store the above-mentioned program by using various types of non-transitory computer readable media and then to supply the program to a computer. The non-transitory computer readable media include various types of tangible storage media. Examples of the non-transitory computer readable media include magnetic storage media (for example, a flexible disk, a magnetic tape, a hard disk drive and so forth), magneto-optical storage media (for example, a magneto-optical disk and so forth), a CD-ROM (Read Only Memory), a CD-R, a CD-R/W, semiconductor memories (for example, a mask ROM, a PROM (Programmable ROM), an EPROM (Erasable PROM), a flash ROM, a RAM (Random Access memory) and so forth) and so forth include. In addition, the program, may be supplied to the computer via various types of transitory computer readable media. Examples of the transitory computer readable media include electric signals, optical signals, electromagnetic waves and so forth. It is possible for the transitory computer readable media to supply the program to the computer via a cable communication path such as an electric wire, an optical fiber and so forth and/or a radio communication path and so forth <Outline of Embodiments>

Before describing the details of the embodiments, first, the outline of the embodiments will be described. FIG. 1 is a block diagram illustrating one schematic configurational example of a semiconductor device 1 according to a first embodiment. As illustrated in FIG. 1, the semiconductor device 1 includes a bitwise operation unit 100, a storage control unit 102 and so forth.

The bitwise operation unit 100 performs a bitwise operation on first n-bit (n is an integer) data that is storage object data and second data of a bit pattern of n bits and thereby generates third data of a bit pattern that the number of "1s" and the number of "0s" are almost the same as each other. Incidentally, here, the number of "1s" is the number of "1s" in the binary system. Likewise, the number of "0s" is the number of "0s" in the binary system. Accordingly, even when a deviation is present in the content of the first data, the first data is converted into the third data that the deviation has been suppressed by the bitwise operation unit 100.

In addition, the storage control unit 102 controls data writing and data reading into and out of a storage unit. Here, the storage unit is a storage device such as the RAM and so forth. In particular, in data writing, the storage control unit 102 stores the third data that has been generated by the bitwise operation unit 100 into a first storage destination of the storage unit and stores fourth data into a second storage destination of the storage unit. Here, the fourth data is the third data or data that is converted into the third data by performing a bitwise operation that has been determined in advance on the data. That is, the fourth data may be the same as the third data and may be data of the form that, for example, each bit of the third data has been inverted.

Consequently, according to the semiconductor device 1, not the first data that the deviation may be possibly present in the content, but the third data that is suppressed in deviation is stored into the storage unit, and also the fourth data that is convertible into the third data is stored into the storage unit. Therefore, when detecting the soft error depending on whether the contents of the data that has been stored into the first storage destination and the data that has been stored into the second storage destination mutually match, unbalance between the soft error detection rate of the data whose content is stored as the fixed value of "0s" (hereinafter, referred to as a 0-fixed detection rate) and the soft error detection rate of the data whose content is stored as the fixed value of "1s" (hereinafter, referred to as a 1-fixed detection rate) is suppressed. Incidentally, the data that is a decision object in decision of data matching and has been stored into the first storage destination is the third data or the data that the soft error has occurred in the third data. In addition, the data that is a decision object in decision of data matching and has been stored into the second storage destination is the fourth data or the data that the soft error has occurred in the fourth data.

<First Embodiment>

Figure 2:
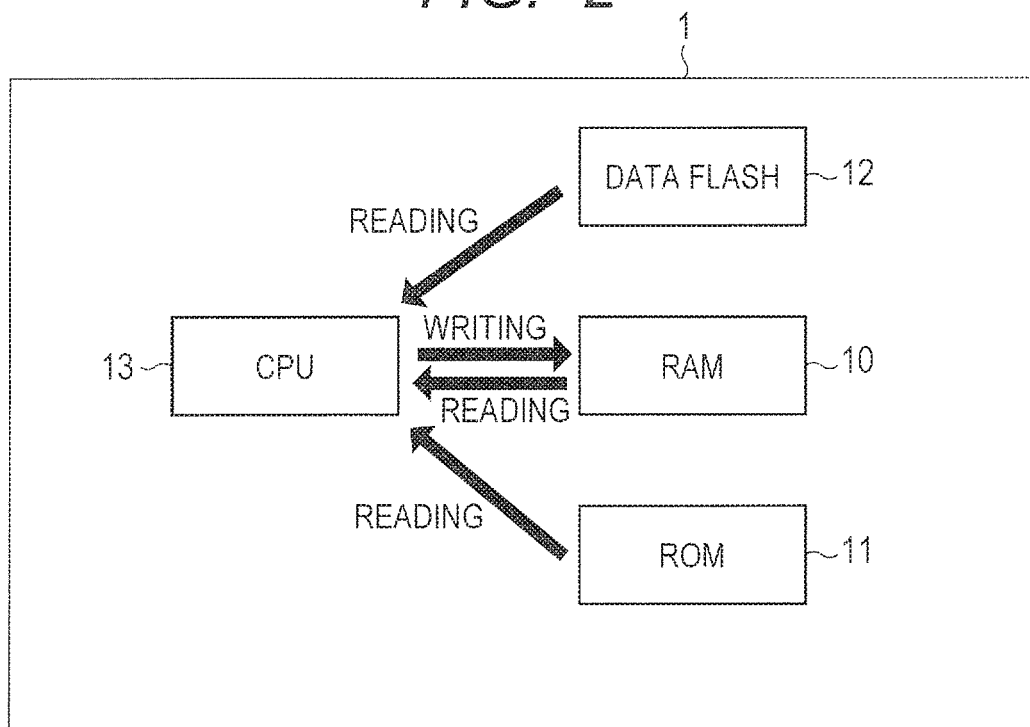
FIG. 2 is a schematic diagram illustrating one example of a hardware configuration of the semiconductor device according to the first embodiment.

In the following, details of the first embodiment will be described. FIG. 2 is a schematic diagram illustrating one example of a hardware configuration of the semiconductor device 1 according to the first embodiment. The semiconductor device 1 is configured as a microcomputer, and a RAM 10, a ROM (Read Only Memory) 11, a data flash 12 that is a flash memory, a CPU (Central Processing Unit) 13 and so forth are loaded on the semiconductor device 1 as illustrated in FIG. 2.

Later described bitwise-operated data and bit-inverted data are stored into the RAM 10 (a built-in RAM) in addition to work data such as intermediate processing data and so forth used in execution of a program concerned. A later described program (hereinafter, referred to as a soft error detection program as the case may be) used for performing a process relevant to detection of the soft error is stored into the ROM 11. Bit pattern data for arithmetic operation of a bit pattern that is used in the later described bitwise operation is stored into the data flash 12. The CPU 13 executes the later described process relevant to soft error detection in accordance with the above-mentioned data that has been read out of the ROM 11. Therefore, the CPU 13 performs reading of the above-mentioned program out of the ROM 11, reading and writing the above-mentioned various kinds of data out of and into the RAM 10, and reading of the bit pattern data for arithmetic operation out of the data flash 12.

Figure 3:
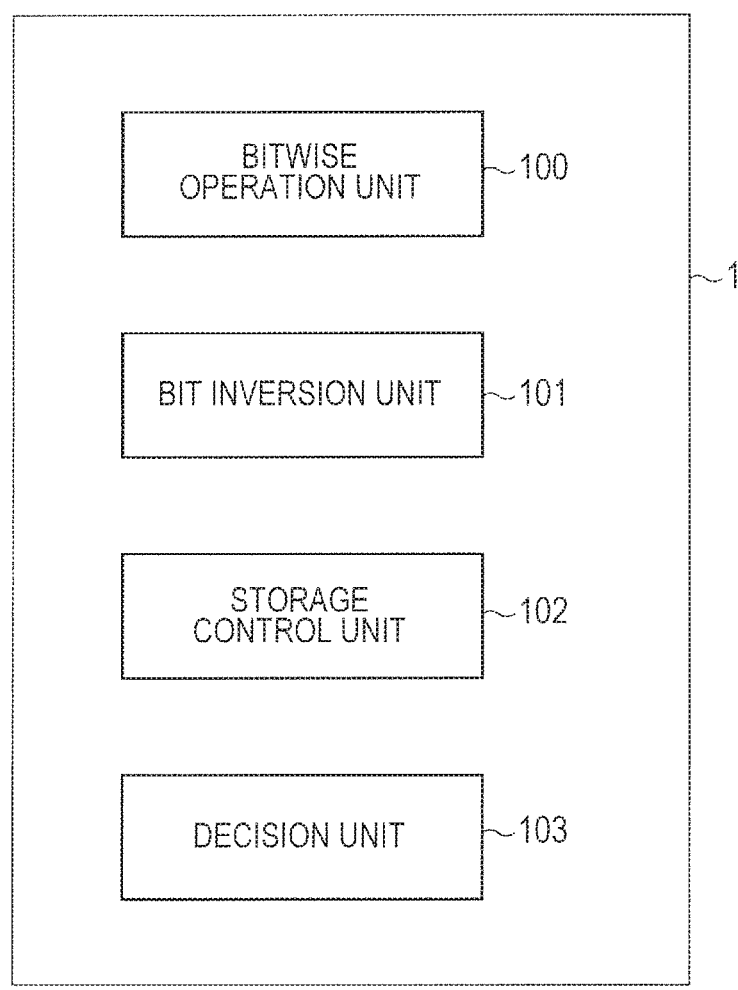
FIG. 3 is a block diagram illustrating one example of a configuration of the semiconductor device according to the first embodiment.

FIG. 3 is a block diagram illustrating one example of the semiconductor device 1 that is implemented by executing the soft error detection program by the CPU 13. The semiconductor device 1 includes the bitwise operation unit 100, a bit inversion unit 101, the storage control unit 102, a decision unit 103 and so forth as illustrated in FIG. 3.

The bitwise operation unit 100 performs the bitwise operation on the data (the first data) to be stored into the RAM 10 and the bit pattern data for arithmetic operation (the second data) that is stored in the data flash 12 and thereby generates the bitwise-operated data (the third data) of the bit pattern that the number of "1s" and the number of "0s" are almost the same as each other as described above.

Here, in the first embodiment, the bit pattern data for arithmetic operation is random data or sequential data. The random data is data that the value of each bit has been randomly set to "0" or "1". The sequential data is data that is configured by arraying a plurality of continuous values in ascending order or descending order. Therefore, in the bit patterns of the random data and the sequential data, the number of "1s" and the number of "0s" are almost the same as each other. In addition, the bitwise operation unit 100 uses an exclusive OR operation as the bitwise operation. That is, the bitwise operation unit 100 arithmetically operates the exclusive OR between n-bit data that is the storage object and the n-bit random data or sequential data and thereby generates the bitwise-operated data of the bit pattern that the number of "1s" and the number of "0s" are almost the same as each other. In the following description, the exclusive OR operation will be called an XOR operation in some cases.

In addition, the bitwise operation unit 100 performs the XOR operation on the data that has been read out of the RAM 10 in order to restore the data that has been stored into the RAM 10 and on which the bitwise operation has been performed into the data of the form before performing the bitwise operation. In this case, the bit pattern data for arithmetic operation that has been used in the XOR operation performed when storing the data concerned is used again.

The bit inversion unit 101 generates the bit inverted data (the fourth data) that is the data of the form that each bit of the bitwise-operated data that has been generated by the bitwise operation unit 100 has been inverted. Although, in the first embodiment, the data that is converted into the bitwise-operated data by inverting each bit is used as the above-mentioned fourth data in this way, the bitwise-operated data may be used as the fourth data as described above, and in this case, the bit inversion unit 101 may be omitted. In addition, the bit inversion unit 101 inverts each bit of the bit-inverted data or the data that the soft error has occurred in the bit-inverted data that has been stored into the RAM 10 in a later described decision made by the decision unit 103.

The storage control unit 102 controls data writing and reading into and out of the data flash 12 and the RAM 10. The storage control unit 102 stores the bitwise-operated data that has been generated by the bitwise operation unit 100 into the first storage destination of the RAM 10 as described above. In addition, the storage control unit 102 stores the bit-inverted data that has been generated by the bit inversion unit 101 into the second storage destination of the RAM 10.

Accordingly, not the original data that the deviation may be possibly present in the content of the data, but the bitwise-operated data that the number of "1s" and the number of "0" are the same as each other and the bit-inverted data of the form that each bit of the bitwise-operated data has been inverted will be stored into the RAM 10. Here, since one piece (the bit-inverted data) of duplicated data is the data of the form that each bit of the other piece (the bitwise-operated data) of the duplicated data has been inverted, it is possible to make storage conditions of both pieces of the duplicated data different from each other, and thereby the probability that the soft errors occur simultaneously in both pieces of the duplicated data is lowered. Therefore, it is possible to suppress a reduction in detection rate caused by simultaneous occurrence of the soft errors in both pieces of the duplicated data.

The decision unit 103 decides whether the contents of the data stored in the first storage destination of the RAM 10 and the data that is stored in the second storage destination of the RAM 10 mutually match. Specifically, the decision unit 103 compares the bitwise-operated data that is stored in the RAM 10 with data of the form that each bit of the bit-inverted data that is stored in the RAM 10 is inverted and decides whether the contents thereof mutually match. When the contents of these pieces of data do not mutually match, the decision unit 103 decides that the soft error has occurred. Thereby, detection of the soft error becomes possible. Incidentally, the data of the form that the soft error has occurred in the bitwise-operated data is included in the bitwise-operated data that is stored in the RAM 10. In addition, the data of the form that the soft error has occurred in the bit-inverted data is included in the bit-inverted data that is stored in the RAM 10. In the following description, the bitwise-operated data so stored means the bitwise-operated data and the data of the form that the soft error has occurred in the bitwise-operated data. In addition, the bit-inverted data so stored means the bit-inverted data and the data of the form that the soft error has occurred in the bit-inverted data.

Accordingly, since whether bit-fixing caused by occurrence of the soft error is present is decided on the basis of the bitwise-operated data of the bit pattern that the number of "1s" and the number of "0s" are the same as each other, the 0-fixed detection rate and the 1-fixed detection rate in the semiconductor device 1 become almost equal to each other.

Figure 4:
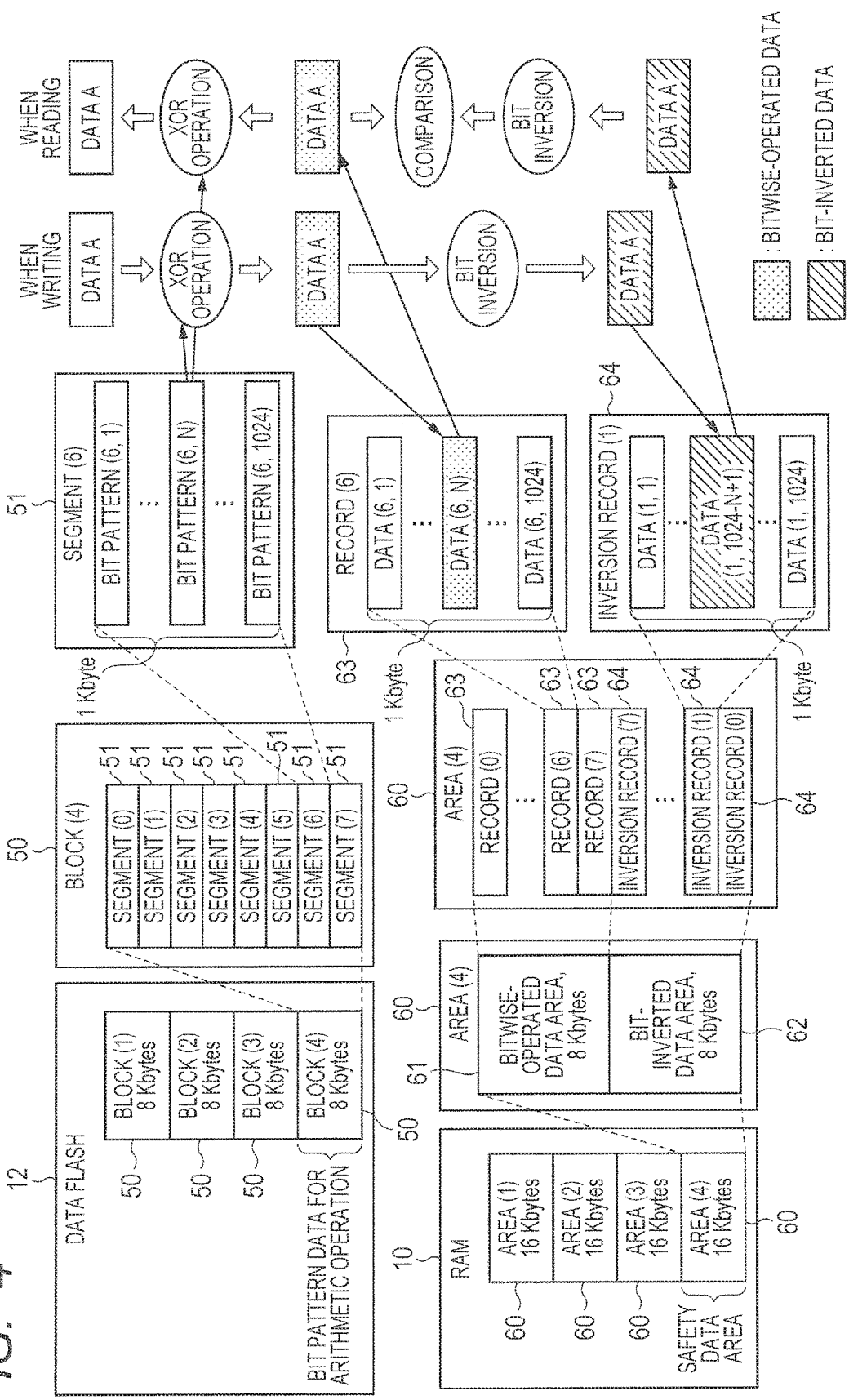
FIG. 4 is a schematic diagram illustrating one example of a relation between a storage area of the semiconductor device according to the first embodiment and an operation of the semiconductor device.

In the following, the semiconductor device will be described in more detail with reference to FIG. 4. Incidentally, in the following description, data that soft error detection is requested will be called safety data. FIG. 4 is a schematic diagram illustrating one example of a relation between storage areas of the semiconductor device 1 and an operation of the semiconductor device 1. Here, although description will be made on the assumption that the capacity of the RAM 10 is about 64 Kbytes and the capacity of the data flash 12 is about 32 Kbytes, these capacities are mere examples and the RAM 10 and the data flash 12 that have capacities other than the above may be used.

The storage area of the data flash 12 is divided into four parts. Specifically, the data flash 12 is divided into four blocks 50 (a block (1) to a block (4)). Then, the block (4) in these blocks 50 is used as a storage area of the bit pattern data for arithmetic operation. The block (4) is divided into eight parts in units of 1 Kbyte. Specifically, the block (4) is divided into eight segments 51 (a segment (0) to a segment (7)). The block 50 is an erasure unit in the data flash 12. That is, here, the erasure unit is about 8 K bytes. The segment 51 is managed byte by byte. Here, it is assumed that a minimum unit for data writing into the data flash 12 is one byte.

Incidentally, pieces of data other than the bit pattern data for arithmetic operation are stored into the blocks other than the block (4) in the blocks 50. In addition, the data flash 12 may be configured only by the block for the bit pattern data for arithmetic operation.

In the first embodiment, the bit pattern data for arithmetic operation to be written into the block (4) is the random data or the sequential data. In case of the sequential data, specifically, for example, data that pieces of data 0x00 to 0xFF are repeated in units of 256 bytes in addressing order may be used. Incidentally, "0x" indicates that the succeeding description is the hexadecimal notation. That is, data of a bit pattern that a plurality of continuous values of 16 bits are arrayed in ascending order may be used.

The storage area of the RAM 10 is divided into four parts. Specifically, the RAM 10 is divided into four areas 60 (an area (1) to an area (4)) in units of 16 Kbytes, Then, in the areas 60, the area (4) is used as the storage area for the safety data. In addition, the area (4) is divided into two areas in units of 8 Kbytes, one of them is an area (a bitwise-operated data area 61) for storing the bitwise-operated data and the other is an area (a bit-inverted data area 62) for storing the bit-inverted data. The bitwise-operated data area 61 is divided into eight parts and the parts so divided are managed as 1-Kbyte-unit records 63 (a record (0) to a record (7)) in units of 1 Kbyte. Likewise, also the bit-inverted data area 62 is divided into eight parts and the parts so divided are managed as 1-Kbyte-unit inversion records 64 (an inversion record (7) to an inversion record (0)) in units of 1 Kbyte.

Incidentally, in the areas of the RAM 10, the area (1) to the area (3) are used, for example, as storage areas for unsafety data that is data other than the safety data. Incidentally, in the following description, the areas (1) to (3) will be called the unsafety data areas and the area (4) will be called the safety data area in some cases.

When the bit-inverted data is to be stored into the bit-inverted data area 62, the storage control unit 102 stores the bit inverted data into the storage destination that has been selected in the reverse order of the addresses. That is, the storage control unit 102 writes first bitwise-operated data into the first address of the 8-Kbyte bitwise-operated data area 61 and writes the bit-inverted data of the form that each bit of the first bitwise-operated data has been inverted into the final address of the 8-Kbyte bit-inverted data area 62. In addition, the storage control unit 102 writes second bitwise-operated data into the address that comes after the first address of the 8-Kbyte bitwise-operated data area 61 and writes the bit-inverted data of the form that each bit of the second bitwise-operated data has been inverted into the address that is smaller than the final address of the 8-Kbyte bit-inverted data area 62 by one byte. After that, the storage control unit 102 stores succeeding pieces of bitwise-operated data and bit-inverted data into the RAM 10 in the same manner as the above.

When the storage control unit 102 writes data (data A in FIG. 4) that is the safety data into an N-th (N=1, 2, . . . , and 1024) 1-byte area of the record (6) as illustrated in FIG. 4, the bitwise operation unit 100 performs the XOR operation on the data A and the bit pattern data for arithmetic operation that is in an N-th area of the segment (6) of the data flash 12, and the storage control unit 102 writes bitwise-operated data that is a result of the XOR operation so performed into an N-th area of the record (6). The bitwise operation unit 100 uses the bit pattern data for arithmetic operation that has been selected in accordance with the storage destination of the bitwise-operated data in the plurality of different pieces of the bit pattern data for arithmetic operation in the bitwise operation in this way. Therefore, the bit pattern data for arithmetic operation that is used for the bitwise-operated data is not fixed. This fact contributes to more suppressing the unbalance between the 0-fixed detection rate and the 1-fixed detection rate. However, the bitwise operation unit 100 may generate the bitwise-operated data by using only one kind of the bit pattern data for arithmetic operation, irrespective of the storage destination. The storage control unit 102 writes the bit-inverted data of the form that each bit of the bitwise-operated data has been inverted by the bit inversion unit 101 into the 1024−(N−1)-th area of the inversion record (1) that is addressed in reverse order.

When the data A that has been written into the RAM 10 is to be read out, the storage control unit 102 reads the bitwise-operated data out of the N-th area of the record (6) and reads the bit-inverted data out of the 1024−(N−1)-th area of the inversion record (1). Then, the bit inversion unit 101 inverts each bit of the bit-inverted data. The decision unit 103 compares the read-out bitwise-operated data with the data that has been inverted by the bit inversion unit 101. Then, when the contents of these pieces of data do not mutually match, the decision unit decides that the soft error has occurred. Detection of the soft error is performed in this way. When the contents of these pieces of data mutually match in decision made by the decision unit 103, the bitwise operation unit 100 performs the XOR operation on the read-out bitwise-operated data and the bit pattern data for arithmetic operation that is present in the N-th area of the segment (6) of the data flash 12 and restores the data. Then, the restored data is returned to a destination that has requested data reading such as the user application and so forth. Since, in the first embodiment, the XOR operation is used in order to generate the data of the bit pattern that the number of "1s" and the number of "0s" are almost the same as each other in this way, the XOR operation may be again performed also when restoring the data to the original data. Therefore, it is possible to simplify the configuration.

Figure 5:
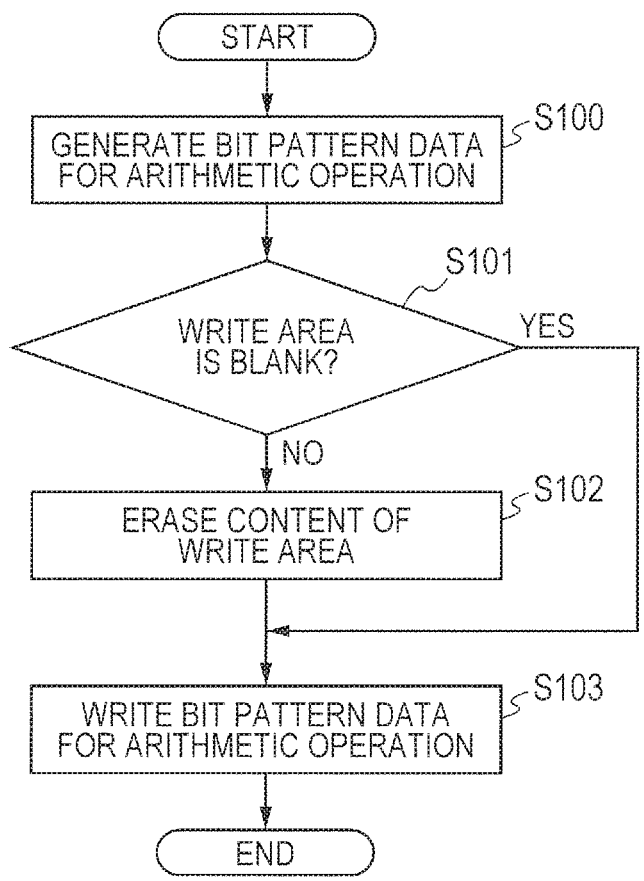
FIG. 5 is a flowchart illustrating one example of an operation of storing bit pattern data for arithmetic operation.

Next, one example of an operation of the semiconductor device 1 will be described following a flowchart. FIG. 5 is a flowchart illustrating one example of an operation of storing the bit pattern data for arithmetic operation. The operation of storing the bit pattern data for arithmetic operation will be described following the flowchart in FIG. 5.

In step 100 (S100), the bit pattern data for arithmetic operation is generated. The bit pattern data for arithmetic operation that is in the form of the random data is generated by using, for example, the Rand function of the C language. The bit pattern data for arithmetic operation that is in the form of the sequential data is generated by configuring the 8-Kbyte data by repeating, for example, the data 0x00 to 0xFF in addressing order.

In step 101 (S101), the storage control unit 102 confirms whether the block (the block (4) in the above-described example) that is an area into which the bit pattern data for arithmetic operation is to be written has a blank. Confirmation is made, for example, by performing blank checking on this block. The CPU 13 requests the data flash 12 to perform, the blank checking by sending a command and thereby the blank checking is performed by hardware provided on the data flash 12. For example, it is possible to process the blank checking by a BGO (Background Operations) function that is loaded on the data flash 12 independently of the operation of the CPU 13. When it is decided that no blank area is present in step 101, the process shifts to step 102. When it has been decided that the blank area is present in step 101, the process shifts to step 103.

In step 102 (S102), the storage control unit 102 erases the content stored in the block that is the area into which the bit pattern data for arithmetic operation is to be written.

In step 103 (S103), the storage control unit 102 writes the bit pattern data for arithmetic operation that has been generated in step 100 into the block.

Figure 6:
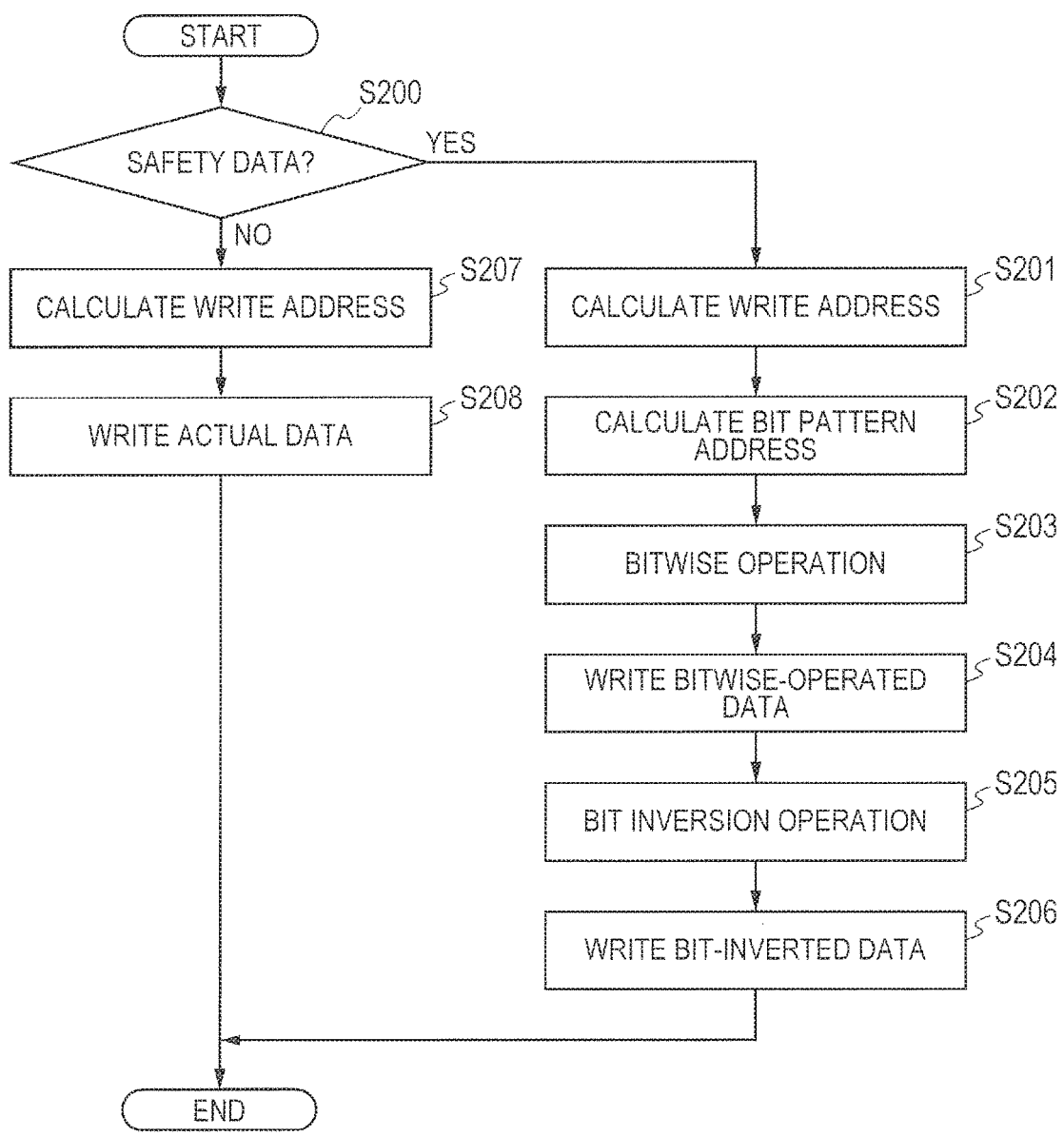
FIG. 6 is a flowchart illustrating one example of an operation of writing data into a RAM.

Next, an operation of writing data into the RAM 10 will be described. FIG. 6 is a flowchart illustrating one example of the operation of writing data into the RAM 10.

In step 200 (S200), the storage control unit 102 decides whether writing object data, that is, storage object data is the safety data. Whether the storage object data is the safety data is notified from, for example, a destination from, which data writing has been requested. When the storage objet data is the safety data, the process shifts to step 201. While, when the storage object data is not the safety data, the process shifts to step 207.

In step 201 (S201), the storage control unit 102 calculates write addresses (addresses of storage destinations) of the bitwise-operated data area 61 and the bit-inverted data area 62. The write address is calculated by assembling the write address by using, for example, the Wrapper function of the C language.

In step 202 (S202), the storage control unit 102 calculates the address of the block (the block 4 in the above-mentioned example) into which the bit pattern data for arithmetic operation corresponding to the writing object data is stored. For example, the storage control unit 102 calculates the storage destination in the data flash 12 into which the bit pattern data for arithmetic operation that corresponds to the writing object data is stored from information indicating the storage destination of the writing object data (that is, the storage destination of the bitwise-operated data).

In step 203 (S203), the bitwise operation unit 100 performs the bitwise operation on the writing object data and the bit pattern data for arithmetic operation that has been loaded from the area indicated by the address that has been calculated in step 202. Specifically, the bitwise operation unit 100 performs the XOR operation by using these pieces of data.

In step 204 (S204), the storage control unit 102 writes the bitwise-operated data that has been generated in step 203 into the bitwise-operated data area 61 that is indicated by the address that has been calculated in step 201.

In step 205 (S205), the bit inversion unit 101 inverts bit by bit the content of the bitwise-operated data that has been generated in step 203.

In step 206 (S206), the storage control unit 102 writes the bit-inverted data that has been generated in step 205 into the bit-inverted data area 62 indicated by the address that has been calculated in step 201. Thereby, the data writing operation is terminated.

On the other hand, in step 207 (S207), the storage control unit 102 calculates the write address of the writing object data. Then, in step 208 (S208), the storage control unit 102 writes the writing object data into the unsafety data area in a state of leaving it as the actual data on the basis of the address that has been calculated in step 207. Thereby, the data writing operation is terminated.

Figure 7:
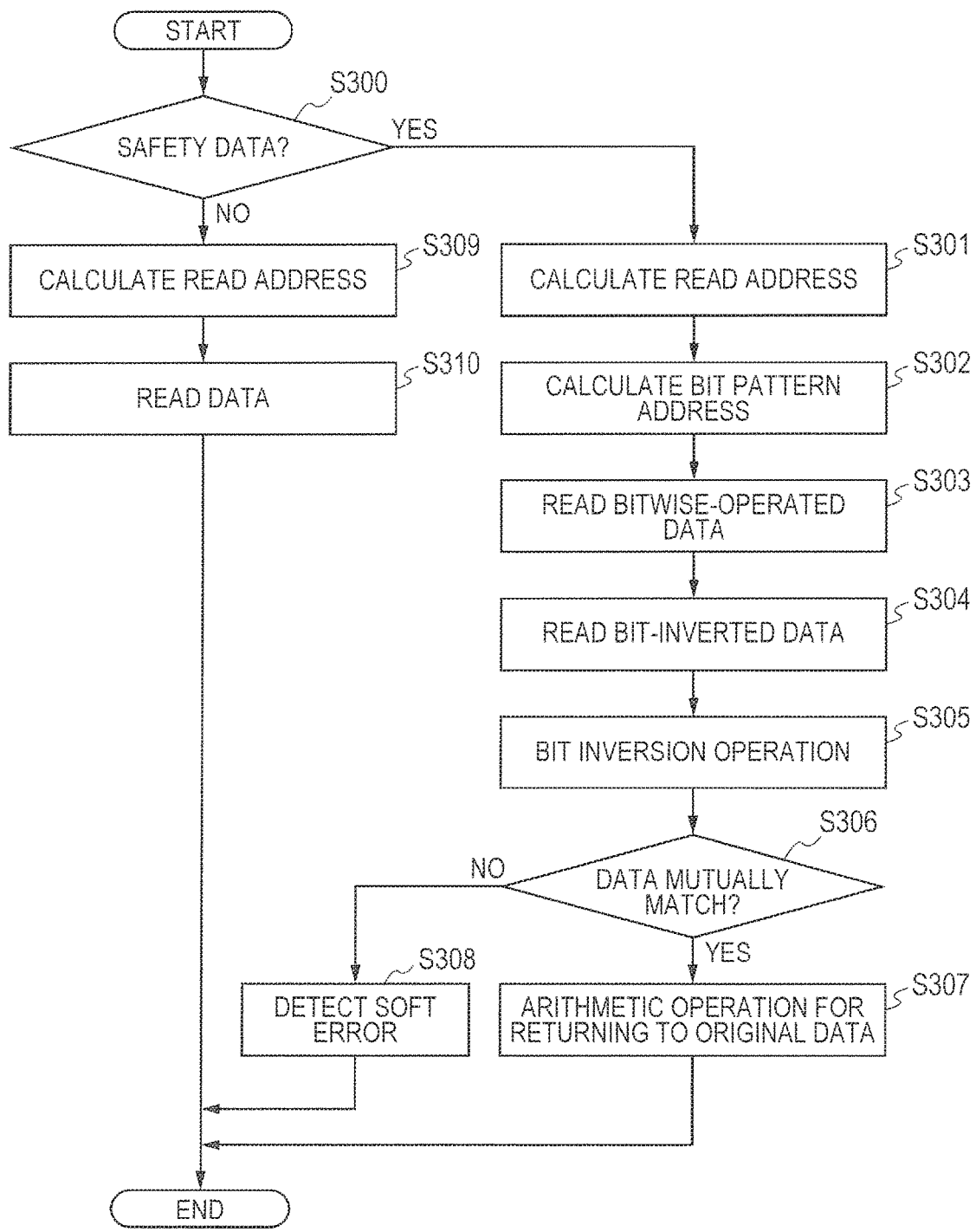
FIG. 7 is a flowchart illustrating one example of an operation of reading data out of the RAM.

Next, an operation of reading data out of the RAM 10 will be described. FIG. 7 is a flowchart illustrating one example of the operation of reading data out of the BAM 10.

In step 300 (S300), the storage control unit 102 decides whether reading object data is the safety data. Whether the reading object data is the safety data is notified from, for example, a destination from which data reading has been requested. When the reading object data is the safety data, the process shifts to step 301. While, when the reading object data is not the safety data, the process shifts to step 309.

In step 301 (S301), the storage control unit 102 calculates read addresses of the bitwise-operated data area 61 and the bit-inverted data area 62. The read address is calculated by assembling the read address by using, for example, the Wrapper function of the C language.

In step 302 (S302), the storage control unit 102 calculates the address of the block (the block (4) in the above-mentioned example) into which the bit pattern data for arithmetic operation corresponding to the reading object data is stored. For example, the storage control unit 102 calculates the storage destination in the data flash 12 into which the bit pattern data for arithmetic operation that corresponds to the reading object data is stored from information indicating the storage destination of the reading object data (that is, the storage destination of the bitwise-operated data).

In step 303 (S303), the storage control unit 102 reads the bitwise-operated data out of the bitwise-operated data area 61 of the address that has been calculated in step 301.

In step 304 (S304), the storage control unit 102 reads the bit-inverted data out of the bit-inverted data area 62 of the address that has been calculated in step 301.

In step 305 (S305), the bit inversion unit 101 inverts all bits of the data that has been read out in step 304.

In step 306 (S306), the decision unit 103 compares the data that has been read out in step 303 with the data obtained in step 305 and decides whether the contents of both pieces of the data mutually match. When it has been decided that the contents of both pieces of the data mutually match, the process shifts to step 307. While, when it has been decided that the contents of both pieces of the data do not mutually match, the process shifts to step 308.

In step 307 (S307), an arithmetic operation for restoring the data to the original data is performed by using the bit pattern data for arithmetic operation that has been loaded on the basis of the address obtained in step 302. Specifically, the bitwise operation unit 100 performs the XOR operation by using the bit pattern data for arithmetic operation and thereby the original data is obtained. The original data so obtained is handed to the read request destination. Thereby, the data reading operation is terminated.

In step 308 (S308), the decision unit 103 decides that the soft error has been detected and notifies the program of the request destination of detection of the soft error. Thereby, the data reading operation is terminated.

On the other hand, in step 309 (S309), the storage control unit 102 calculates the read address of the reading object data. Then, in step 310 (S310), the storage control unit 102 reads the actual data that is the reading object out of the unsafety data area on the basis of the address that has been calculated in step 309. Thereby, the data reading operation is terminated.

Figure 8:
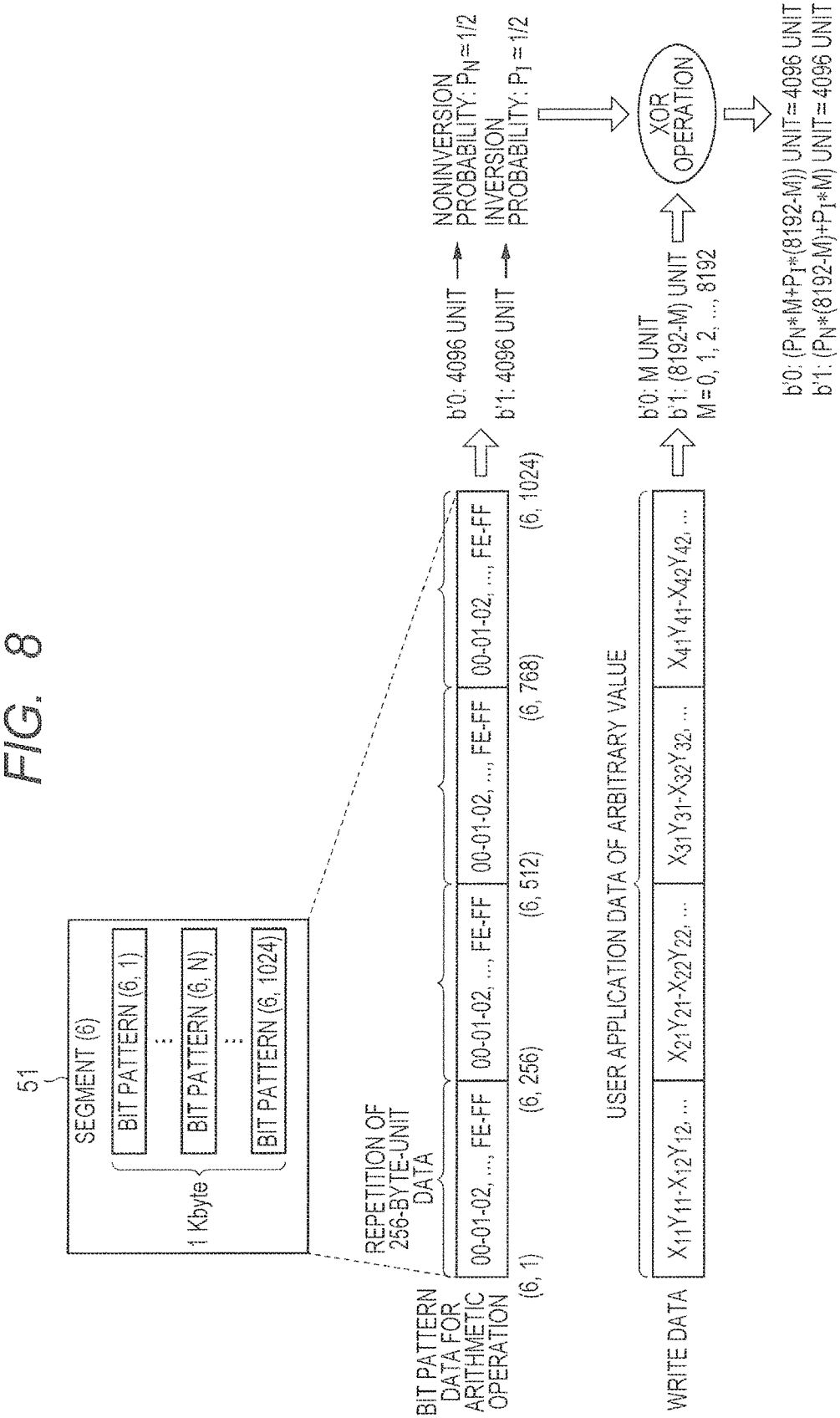
FIG. 8 is a schematic diagram illustrating one concrete example that a deviation in data of a user application is improved by the semiconductor according to the first embodiment.

Next, a concrete example that a deviation in data of the user application is improved by the above-mentioned semiconductor device 1 will be described with reference to FIG. 8.

It is assumed that the sequential bit pattern data for arithmetic operation that the pieces of data 0x00 to 0xFF are repeated in units of 256 bytes is stored in the segment (6) of the data flash 12. In this case, 4096 "b'0s" and 4096 "b'1s" are present in the bit pattern data for arithmetic operation. Incidentally, "b'0" indicates "0" of the binary notation and "b'1" indicates "1" of the binary notation. The XOR operation is performed on write data that is the data of the user application by using the bit pattern data for arithmetic operation. When it is assumed that in each bit of the write data, a probability that each bit holds the same value still after the XOR operation has been performed is designated by $P_N$ and a probability that each bit is inverted after the XOR operation has been performed is designated by $P_1$, the ratio of $P_N$ to $P_1$ becomes ½ approximately. Since the data of the user application is arbitrary value, when it is assumed that M "b'0s" and (8192−M) "b'1s" are present, the numbers of "b'0s" and "b'1s" mutually approach 4096 approximately after the XOR operation has been performed. Therefore, the deviation in data of the user application is improved. Incidentally, it is assumed that M=0, 1, 2, . . . , and 8192. Since when the size of the data of the use application is increased, the approximate accuracy of $P_N$ and $P_1$ is increased in general, and therefore the deviation is more improved. Although, in FIG. 8, one example of a case where the bit pattern data for arithmetic operation to be used is the sequential data is illustrated, the probability that the numbers of "b'0s" and "b'1s" mutually approximate equally is high also in case of the random data and therefore almost the same result as that in a case of using the sequential data is obtained.

As described above, according to the semiconductor device 1, not the data that the deviation may be possibly present in the content of the data, but the data that the deviation has been suppressed is stored and therefore the unbalance between the 0-fixed detection rate and the 1-fixed detection rate is suppressed.

<Second Embodiment>

Next, the second embodiment will be described. In the first embodiment, the semiconductor device 1 stores both of the above-mentioned third data (that is, the bitwise-operated data) and the fourth data (that is, the third data or the data that is converted into the third data by performing the bitwise operation that has been determined in advance on the data) into the built-in RAM 10. The second embodiment is different from the first embodiment in the point that one of the third data and the fourth data is stored into the built-in storage unit by the storage control unit 102 and the other is stored into an external storage unit by the storage control unit 102. Although, in the following, a configurational example that the bit-inverted data, that is, the fourth data is stored into the external storage unit will be described, the semi conductor device may be configured such that the bitwise-operated data is stored into the external storage unit.

Figure 9:
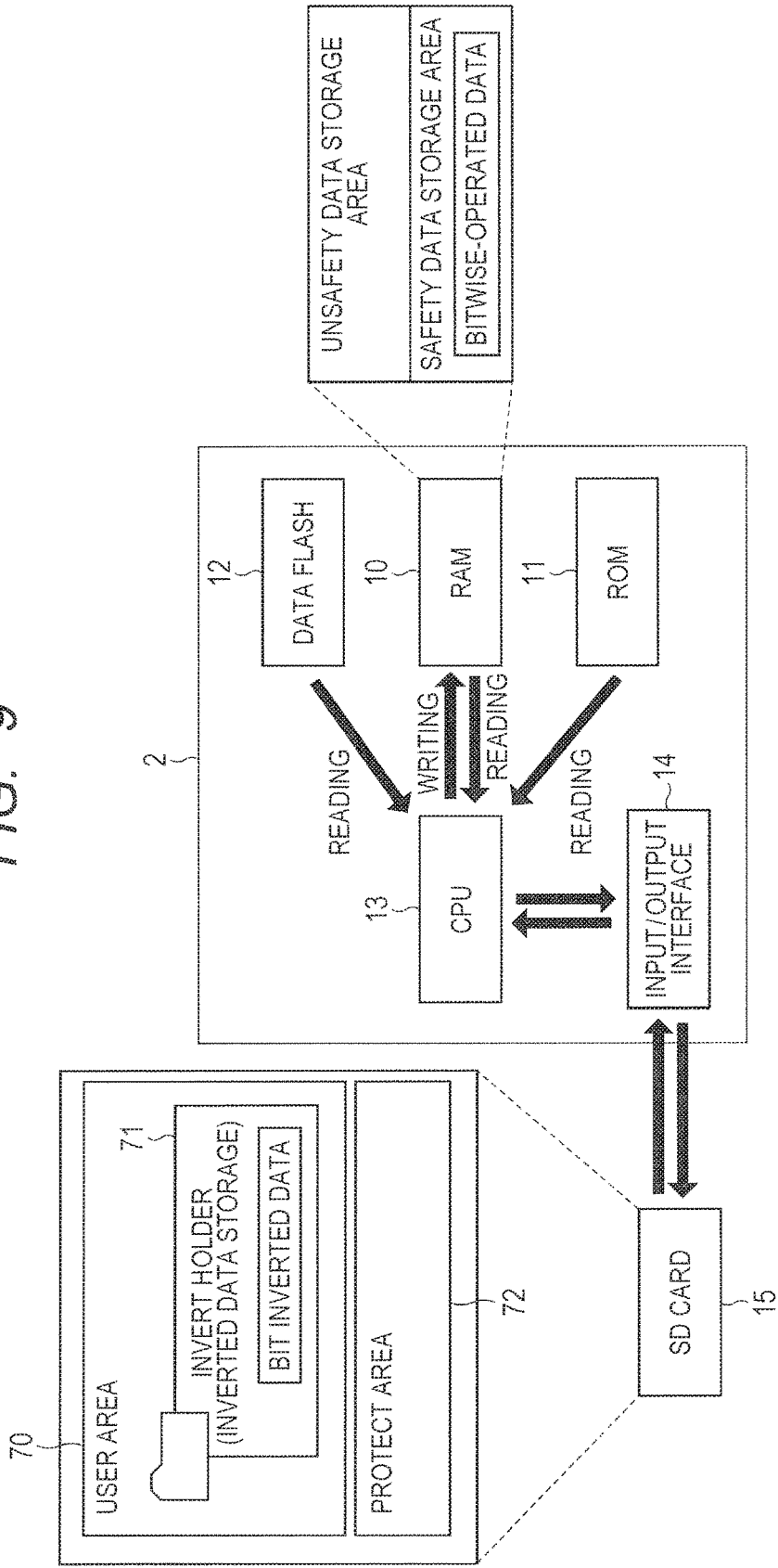
FIG. 9 is a schematic diagram illustrating one example of a configuration of a semiconductor device according to a second embodiment.

FIG. 9 is a schematic diagram illustrating one example of a configuration of a semiconductor device 2 according to the second embodiment. In the following, description of the configuration of the semiconductor device 2 that is the same as that of the semiconductor device 1 is omitted and only different points will be described. The semiconductor device 2 is configured as a microcomputer and as illustrated in FIG. 9, the RAM 10, the ROM 11, the data flash 12, the CPU 13, an input/output interface 14 and so forth are loaded on the semiconductor device 2. Here, the RAM 10 is the storage unit that is built in the semiconductor device 2 and the input/output interface 14 is an interface through which an SD card (Secure Digital memory card) 15 that is coupled to the semiconductor device 2 inputs and outputs data. Incidentally, here, although one example of a case where the SD card 15 is used as the external storage unit will be described, the external storage unit may be another external memory such as a USB (Universal Serial Bus) memory and so forth.

The input/output interface 14 includes an SD host I/F module that controls the SD card 15 as hardware. In addition, an SD card driver (software) adapted to control the module and access to the SD card 15 and a file system (software) that handles data as a file are stored in the ROM 11. These pieces of software are executed by the CPU 13. The storage control unit 102 according to the second embodiment stores the bitwise-operated data into the RAM 10 and stores the bit-inverted data into the SD card 15. In this case, the storage control unit 102 prepares a holder 71 (an INVERT holder illustrated in FIG. 9) for storing the bit-inverted data in a user area 70 of the SD card 15 and stores the bit-inverted data into the holder 71. Incidentally, when CPRM (Content Protection for Recordable Media) that is a security function is not used, the holder for storing the bit-inverted data may be prepared in a protect area 72 that functions as a free space of the SD card 15. Here, the protect area 72 is an area that becomes accessible after execution of a security related protocol sequence. Incidentally, the storage control unit 102 according to the second embodiment is configured to store the bit pattern data for arithmetic operation into the data flash 12 similarly to that of the semiconductor device 1.

When the data that has been written is to be read out, the decision unit 103 according to the second embodiment decides whether the contents of the bit-inverted data that has been read out of the SD card 15 and the bitwise-operated data that has been read out of the RAM 10 mutually match. Specifically, the decision unit 103 decides whether the contents of the data of the form that all bits of the bit-inverted data that has been read out of the SD card 15 have been inverted bit by bit by the bit inversion unit 101 and the bitwise-operated data that has been read out of the RAM 10 mutually match. When the content of these pieces of data do not mutually match, the decision unit 103 detects it as the soft error.

As above, although the second embodiment has been described above, the data that is stored into the SD card 15 may be managed as the file by the file system loaded on the ROM 11 and may be also managed by using a logical address. In addition, access to the SD card 15 may be gained easily by using a serial module, in place of the SD host I/F module and the SD card driver.

As described above, the semiconductor device 2 stores one piece of the duplicated data into the external memory. Therefore, a reduction in capacity of the built-in RAM 10 and/or sure acquisition of the capacity to be used as the storage destination of data for other applications become(s) possible. In addition, since the bitwise-operated data and the bit-inverted data are stored into physically separated places, the probability that the soft errors occur simultaneously in both pieces of the duplicated data is lowered. Therefore, it becomes possible to suppress a reduction in detection rate caused by simultaneous occurrence of the soft errors in both pieces of the duplicated data.

<Third Embodiment>

Figure 10:
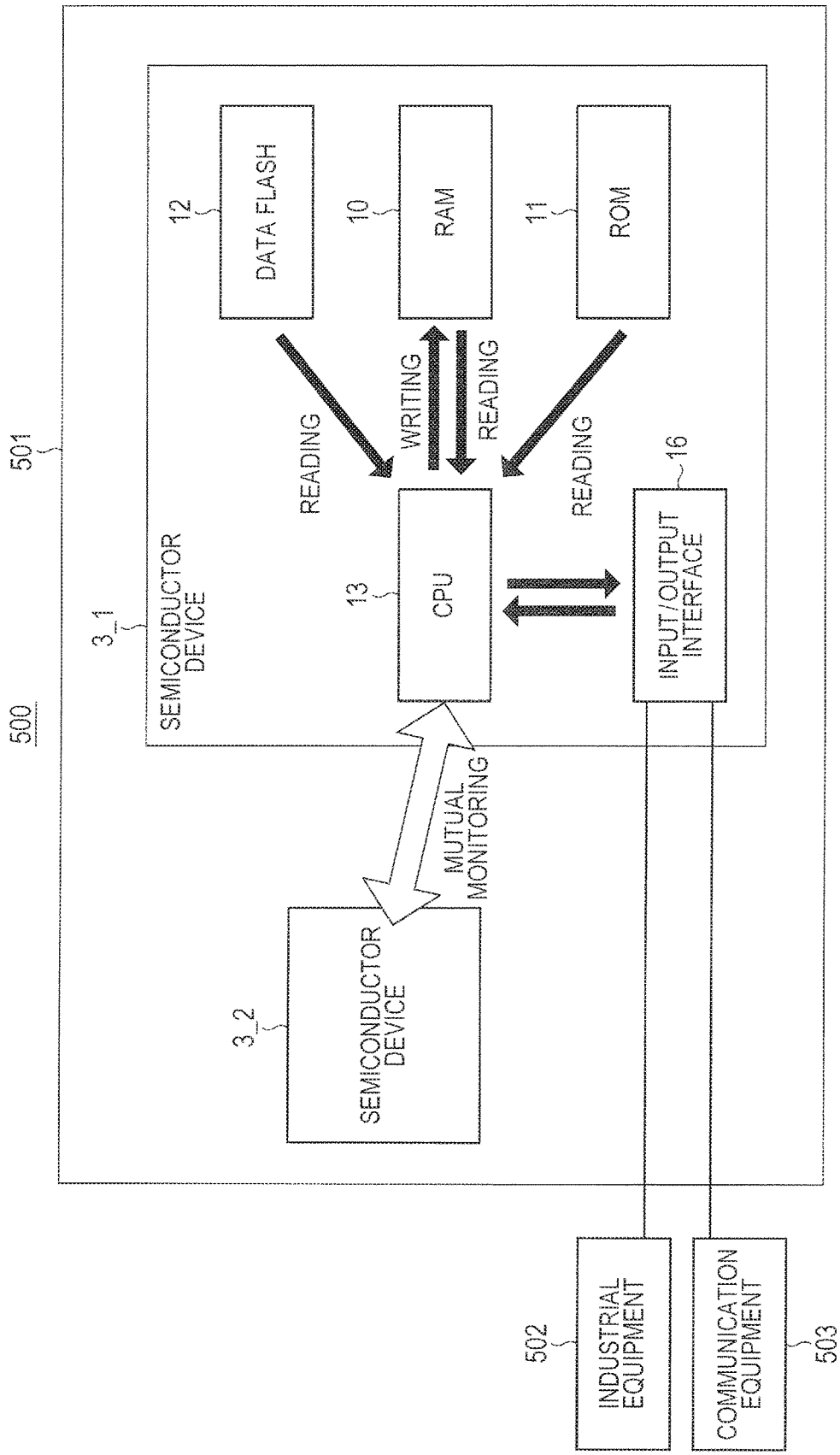
FIG. 10 is a schematic diagram illustrating one example of a hardware configuration of a functional safety system according to a third embodiment.

Next, the third embodiment will be described. In the third embodiment, a configurational example of a case where the above-mentioned semiconductor device has been incorporated into a functional safety system will be described. FIG. 10 is a schematic diagram illustrating one example of a hardware configuration of a functional safety system 500. The functional safety system 500 includes functional safety equipment 501 that is equipment coping with functional safety and so forth. The functional safety equipment 501 includes semiconductor devices 3_1 and 3_2 that are configured as microcomputers and is coupled with industrial equipment 502 such as a robot, an AC servo motor, a machine tool and so forth and/or communication equipment 503 such as a network server, a cell phone, a printer and so forth over a not illustrated network and controls these pieces of the equipment and communicates with these pieces of the equipment. The functional safety equipment 501 is configured in conformity to functional safety standards such as IEC61508 and so forth. In particular, in the third embodiment, the two microcomputers, that is, the semiconductor devices 3_1 and 3_2 are loaded on the functional safety equipment 501 and the semiconductor devices 3_1 and 3_2 mutually monitor the mutual states.

The semiconductor devices 3_1 and 3_2 have the same configuration. Therefore, in the following, the configuration of the semiconductor device 3_1 will be described in order to avoid repetitive and redundant description. The RAM 10, the ROM 11, the data flash 12, the CPU 13, an input/output interface 16 and so forth are loaded on the semiconductor device 3_1. The above-mentioned program used for performing a process relevant to soft error detection is stored in the ROM 11, in addition to programs used for performing processes relevant to control, communication and so forth. The bitwise-operated data and the bit-inverted data are stored in the RAM 10 in addition to the work data. Incidentally, in each of the RAM 10 and ROM 11, the area that the safety data is arranged is separated from the area that the unsafety data is arranged by a Memory Management Unit (MMU) and a Memory Protection Unit (MPU) in order to protect the safety data in conformity to the functional safety standards. The bit pattern data for arithmetic operation is stored in the data flash 12 in addition to parameters used in the processes relevant to the control, the communication and so forth. The CPU 13 executes the above-mentioned process relevant to soft error detection in accordance with the program that has been read out of the ROM 11, in addition to arithmetic operations relevant to the control, the communication and so forth. The CPU 13 is sometimes called a processing unit. The input/output interface 16 is a peripheral module and is an interface to be coupled with the industrial equipment and/or the communication equipment and so forth via communication configurations such as an Ethernet (a registered trade mark) configuration, a USB configuration, a serial communications configuration and so forth.

Figure 11:
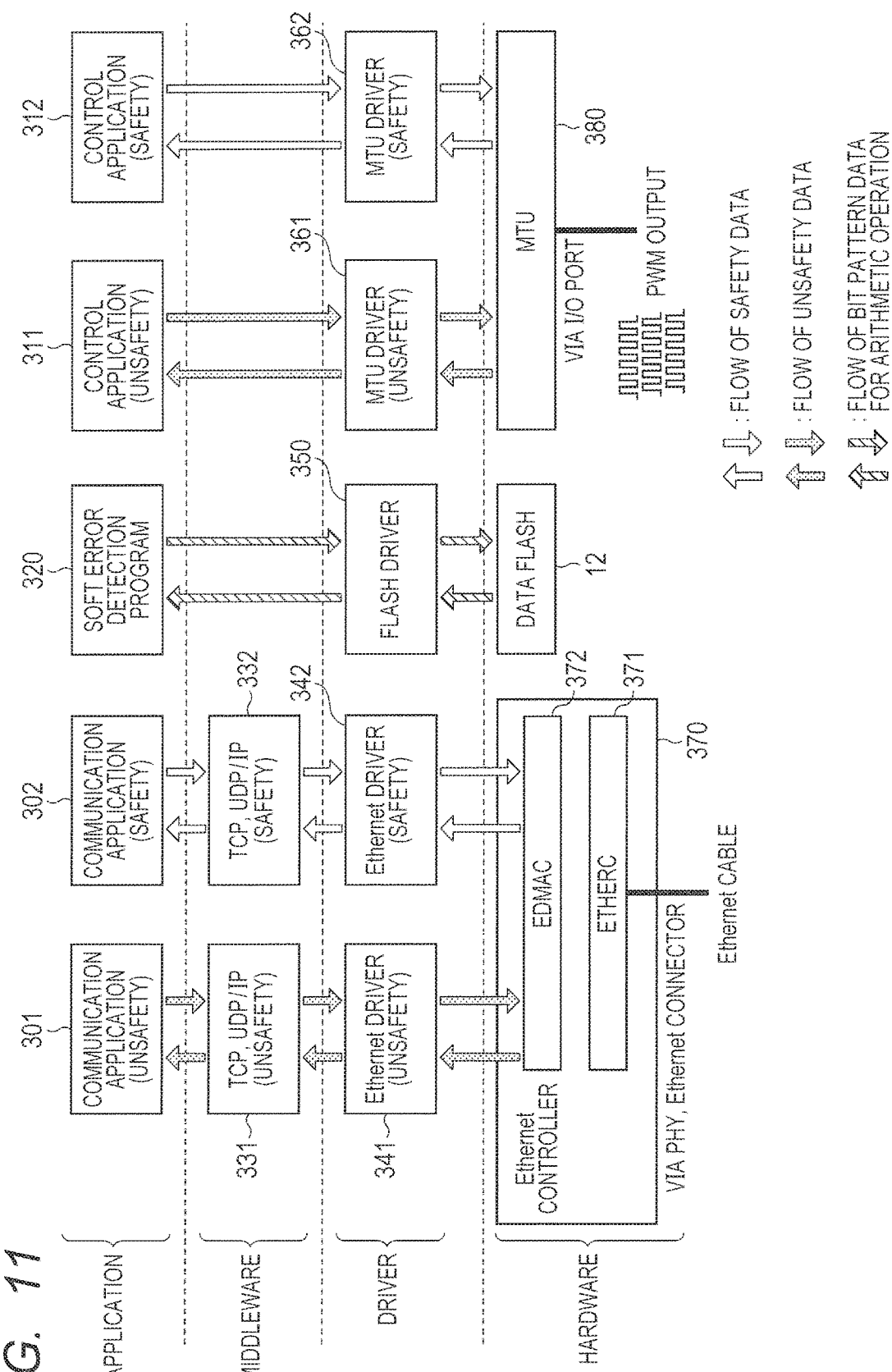
FIG. 11 is a block diagram, illustrating one example of a logical configuration of a semiconductor device according to the third embodiment.

Next, logical configurations of the semiconductor devices 3_1 and 3_2 will be described. FIG. 11 is a block diagram illustrating one example of the logical configurations of the semiconductor devices 3_1 and 3_2, The semiconductor devices 3_1 and 3_2 are configured with the processes, buses and memories to be arranged being mutually separated in hardware in conformity to the functional safety standards. Accordingly, each of the semiconductor devices 3_1 and 3_2 includes software for handling the safety data and software for handling the unsafety data. Incidentally, software and hardware that will be indicated in the following are mere examples and may be replaced with other software and hardware on condition that they have functions equivalent to those of the following software and hardware.

Each of the semiconductor devices 3_1 and 3_2 includes a communication application for unsafety data 301, a communication application for safety data 302, a control application for unsafety data 311, a control application for safety data 312, a soft error detection program 320 and so forth as applications. Each of the communication applications 301 and 302 is an Industrial Ethernet communication application. As representative Industrial Ethernet standards, EtherNet/IP, PROFINET, EtherCAT and so forth are available. Each of the control applications 311 and 312 is used to control an industrial motor that is incorporated into the AC servo motor, an industrial motor that is incorporated into the robot and so forth.

In addition, each of the semiconductor devices 3_1 and 3_2 includes a TCP (Transmission Control Protocol), UDP (User Datagram Protocol)/IP (Internet Protocol) protocol suite for unsafety data 331 and a TCP, UDP/IP protocol suite for safety data 332 as middleware. Each of the TCP, UDP/IP protocol suites 331 and 332 is adapted to perform logical communication connection management, TCP or UDP packet transmission and reception processing, management of coupling equipment information and so forth.

In addition, each of the semiconductor devices 3_1 and 3_2 includes an Ethernet driver for unsafety data 341, an Ethernet driver for safety data 342, a flash driver 350, an MTU driver for unsafety data 361, an MTU driver for safety data 362 and so forth as drivers. Each of the Ethernet drivers 341 and 342 performs transmission/reception processing of Ethernet frames, coupling detection of an Ethernet cable and so forth by using an Ethernet controller 370 that is an I/O module. The flash driver 350 manages inputting/outputting relative to the data flash 12. Each of the MTU drivers 361 and 362 generates a PWM (Pulse Width Modulation) waveform that is a control signal for the industrial motor by using an MTU (Multi-Function Timer Pulse Unit) that is a timer module.

In addition, each of the semi conductor devices 3_1 and 3_2 includes an Ethernet controller 370 and an MTU 380 as hardware in addition to the above mentioned hardware. The Ethernet controller 370 includes an ETHERRC (Ethernet Controller) 371 that processes an MAC (Media Access Control) layer, an EDMAC (DMA Controller for the Ethernet Controller) 372 that efficiently processes data transmission/reception to/from the CPU 13 and so forth and performs inputting and outputting relative to the Ethernet cable via a PHY (Physical Layer) that converts a digital signal into an analog signal and an Ethernet connector (in general, RJ-45). The MTU 380 generates a timing signal of the PWM waveform and outputs the PWM waveform via an I/O port of the input/output interface 16.

Figure 12:
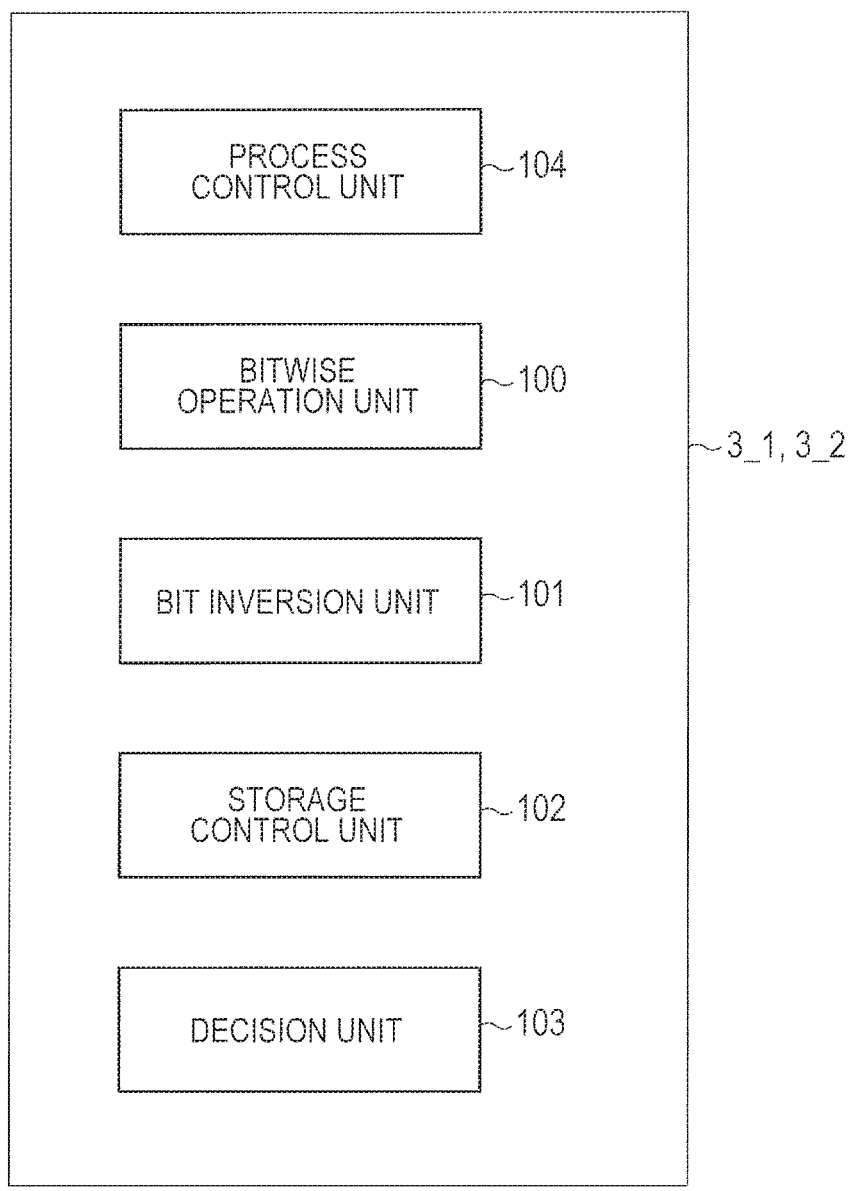
FIG. 12 is a block diagram illustrating one example of a configuration of the semiconductor device according to the third embodiment.

Here, the soft error detection program 320 in the third embodiment will be described. FIG. 12 is a block diagram illustrating one example of a configuration of each of the semiconductor devices 3_1 and 3_2 that is implemented by executing the soft error detection program 320 by the CPU 13. As illustrated in FIG. 12, each of the semiconductor devices 3_1 and 3_1_3 2 includes a process control unit 104, the bitwise operation unit 100, the bit inversion unit 101, the storage control unit 102, the decision unit 103 and so forth. Since the bitwise operation unit 100, the bit conversion unit 101, the storage control unit 102 and the decision unit 103 have already been described, description thereof is omitted. The process control unit 104 performs notification of the soft error and mutual monitoring. Incidentally, the process control unit 104 may be implemented by a program, other than the soft error detection program 320, such as the middleware and so forth.

Figure 13:
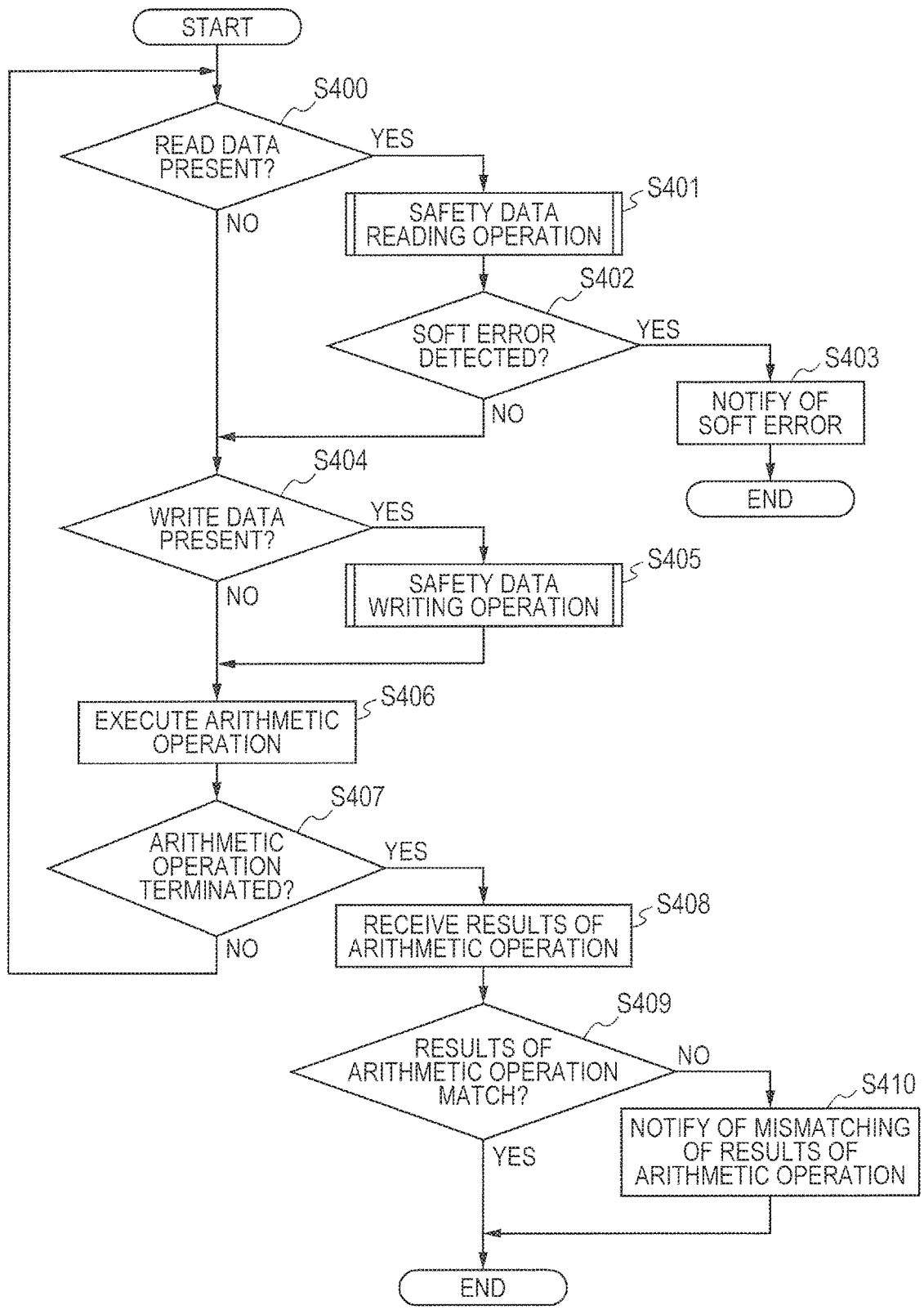
FIG. 13 is a flowchart illustrating one example of an operation of the semiconductor device according to the third embodiment.

In the following, the operation of the functional safety system 500 will be described centering on the operation of the semiconductor device 3_1. FIG. 13 is a flowchart illustrating one example of the operation of the semiconductor device 3_1. Incidentally, in general, in functional safety equipment that performs mutual monitoring by using two microcomputers, configurations as follows are conceived. The first configuration is of the type that equivalent operations are performed by the two microcomputers. The second configuration is of the type that mutual monitoring and control according to the safety application are performed by one microcomputer and only mutual monitoring is performed by the other microcomputer. Although the above mentioned method of detecting the soft error is applicable to both of the configurations, here, a case where the equivalent operations are performed by the two microcomputers so as to perform an arithmetic operation for mutual monitoring will be described by way of example. Incidentally, since an arithmetic operation time limit is set for the arithmetic operation for mutual monitoring, it is assumed that an arithmetic operation of a unit that is terminated in the time limit is performed.

In step 400 (S400), the process control unit 104 decides whether the safety data that is to be read out of the RAM 10 so as to be used for the arithmetic operation is present. When the safety data that is to be read out so as to be used for the arithmetic operation is present, the process shifts to step 401. On the other hand, when the safety data that is to be read out so as to be used for the arithmetic operation is not present, the process shifts to step 404.

In step 401 (S401), reading of the safety data out of the RAM 10 is performed. Specifically, the processes of step S301 to step S308 illustrated in FIG. 7 are performed.

In step 402 (S402), the process control unit 104 decides whether the soft error has been detected in data reading. When the soft error has been detected, in step 403 (S403), the process control unit 104 notifies the communication application 302 or the control application 312 that is the safety application for performing the communication or the control of detection of the soft error. In addition, the process control unit 104 also notifies the semiconductor device 3_2 of detection of the soft error. Thereafter, the process is terminated. Here, notification to the semiconductor device 3_2 is performed by using, for example, various kinds of serial communications and/or an external interruption terminal.

In step 404 (S404), the process control unit 104 decides whether the safety data that is to be written into the RAM 10 so as to be used for the arithmetic operation is present. When the safety data that is to be written so as to be used for the arithmetic operation is present, the process shifts to step 405. On the other hand, when the safety data that is to be written so as to be used for the arithmetic operation is not present, the process shifts to step 406.

In step 405 (S405), writing of the safety data into the RAM 10 is performed. Specifically, the processes of step S201 to step S206 illustrated in FIG. 6 are performed. After the process in step 405 has been performed, the process shifts to step 406.

In step 406 (S406), the process control unit 104 performs an arithmetic operation according to the communication application 302 or the control application 312.

In step 407 (S407), the process control unit 104 decides whether the arithmetic operation of a predetermined unit has been terminated. When the arithmetic operation of the predetermined unit is not terminated, the process returns to step 400. While, when the arithmetic operation of the predetermined unit has been terminated, the process shifts to step 408.

In step 408 (S408), the process control unit 104 transmits a result of the arithmetic operation performed to the semiconductor device 3_2 and the same result of the arithmetic operation performed is received from the semiconductor device 3_2. Here, the communication between the semiconductor device 3_1 and the semiconductor device 3_2 is performed by using, for example, the various kinds of serial communications and/or the external interruption terminal.

In step 409 (S409), the process control unit 104 compares the result (one processing result) of the arithmetic operation performed by its own semiconductor device 3_1 with the result (the other processing result) of the arithmetic operation received from the semiconductor device 3_2 and decides whether both results mutually match. When the results mutually match, the process is terminated. On the other hand, when the results do not mutually match, in step 410 (S410), the process control unit 104 notifies the communication application 302 or the control application 312 and the semiconductor device 3_2 of occurrence of mismatching of the results of the arithmetic operation performed.

As described above, according to the third embodiment, it is possible to easily configure the functional safety equipment that implements the above-mentioned soft error detecting method. In addition, it is possible to implement safer control and/or communication by mutually comparing the processing results obtained from the plurality of semiconductor devices. Incidentally, the above-mentioned second embodiment 2 may be applied to the functional safety system 500 according to the third embodiment. In addition, semiconductor devices according to later described embodiments may be applied to the functional safety system 500.

<Fourth Embodiment>

Figure 14:
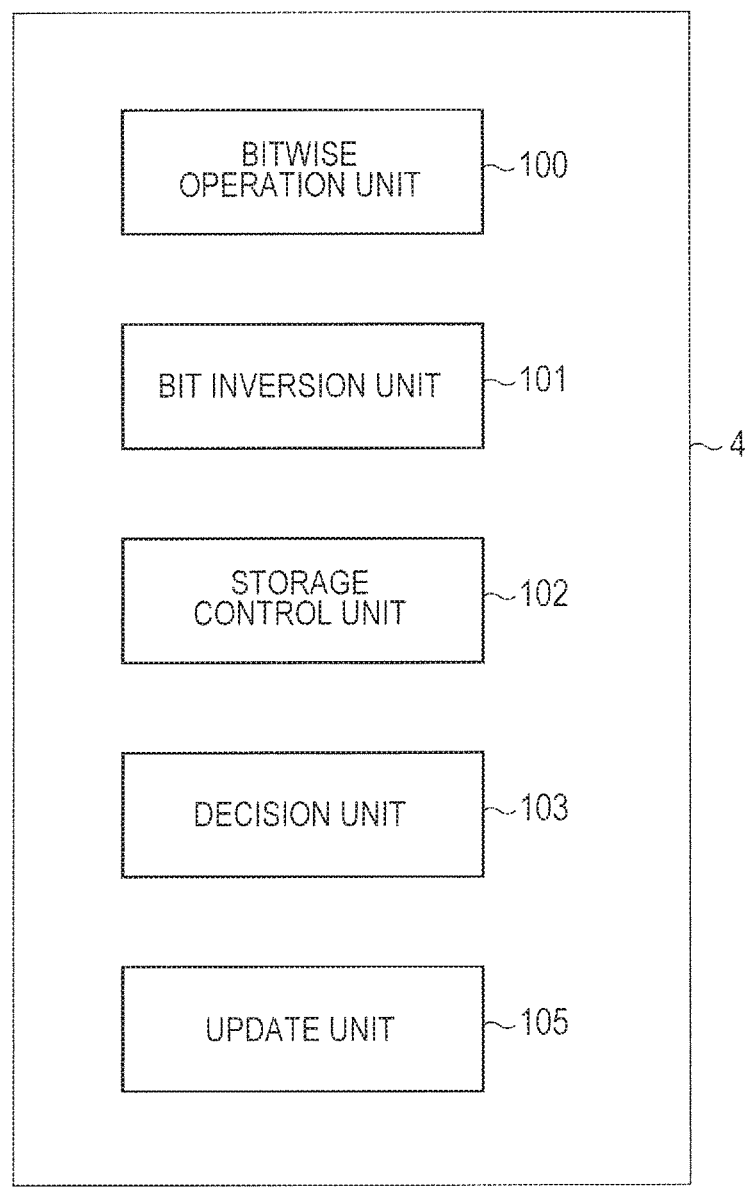
FIG. 14 is a block diagram illustrating one example of a configuration of a semi conductor device according to a fourth embodiment.

Next, the fourth embodiment will be described. The fourth embodiment is characteristic in the point that the bit patter data for arithmetic operation is updated in comparison with other embodiments. FIG. 14 is a block diagram illustrating one example of a configuration of a semiconductor device 4 according to the fourth embodiment that is implemented by executing the soft error detection program by using the CPU 13. As illustrated in FIG. 14, the semiconductor device 4 includes the bitwise operation unit 100, the bit inversion unit 101, the storage control unit 102, the decision unit 103, an update unit 105 and so forth. Since the bitwise operation unit 100, the bit inversion unit 101, the storage control unit 102, and the decision unit 103 have already been described, description thereof is omitted. Incidentally, also the semiconductor device 4 is configured as the microcomputer and the RAM 10, the ROM 11, the data flash 12, the CPU 14 and so forth are loaded on the semiconductor device 4.

The update unit 105 updates the bit pattern data for arithmetic operation (the above-mentioned second data) that is stored in the data flash 12, and updates the above-mentioned third data (the bitwise-operated data) and the above-mentioned fourth data that are based on the second data obtained before updating respectively to the third data and the fourth data that are based on the updated second data. Here, although in the fourth embodiment, a configurational example of a case where the bit-inverted data of the form that each bit of the bitwise-operated data has been inverted is used as the fourth data is illustrated, the third data may be used as the fourth data and data that is converted into the third data by performing a bitwise operation that has been determined in advance on the data may be used.

The update unit 105 updates the bit pattern data for arithmetic operation in the data flash 12. In this case, the update unit 105 performs updating by replacing the storage destination of the bit pattern data for arithmetic operation obtained before updating with the storage destination of the bit pattern data for arithmetic operation obtained after updating. In addition, the update unit 105 updates the bitwise-operated data in the RAM 10. In this case, the update unit 105 performs updating by replacing the storage destination of the bitwise-operated data obtained before updating with the storage destination of the bitwise-operated data obtained after updating. Likewise, the update unit 105 updates the bit-inverted data in the RAM 100. In this case, the update unit 105 performs updating by replacing the storage destination of the bit-inverted data obtained before updating with the storage destination of the bit-inverted data obtained after updating. The update unit 105 temporally saves the bit patter data for arithmetic operation, the bitwise-operated data and the bit-inverted data that are obtained before updating and thereafter restores these pieces of data obtained after updating to storage destinations that are different from the previous storage destinations.

Incidentally, an interval of updating performed by the update unit 105 is not specified (it depends on the system). For example, periodical updating using a not illustrated built-in timer may be performed and updating may be performed by referring to the number of safety data transmission/reception times and in accordance with the number of safety data transmission/reception times.

The storage control unit 102 changes read destinations and/or write destinations of the bitwise-operated data and the bit-inverted data in accordance with the progress of updating performed by the update unit 105 so as to make it possible to perform data reading and/or data writing in parallel with updating. Incidentally, details of this operation performed by the storage control unit 102 will be described by using a flowchart.

Figure 15:
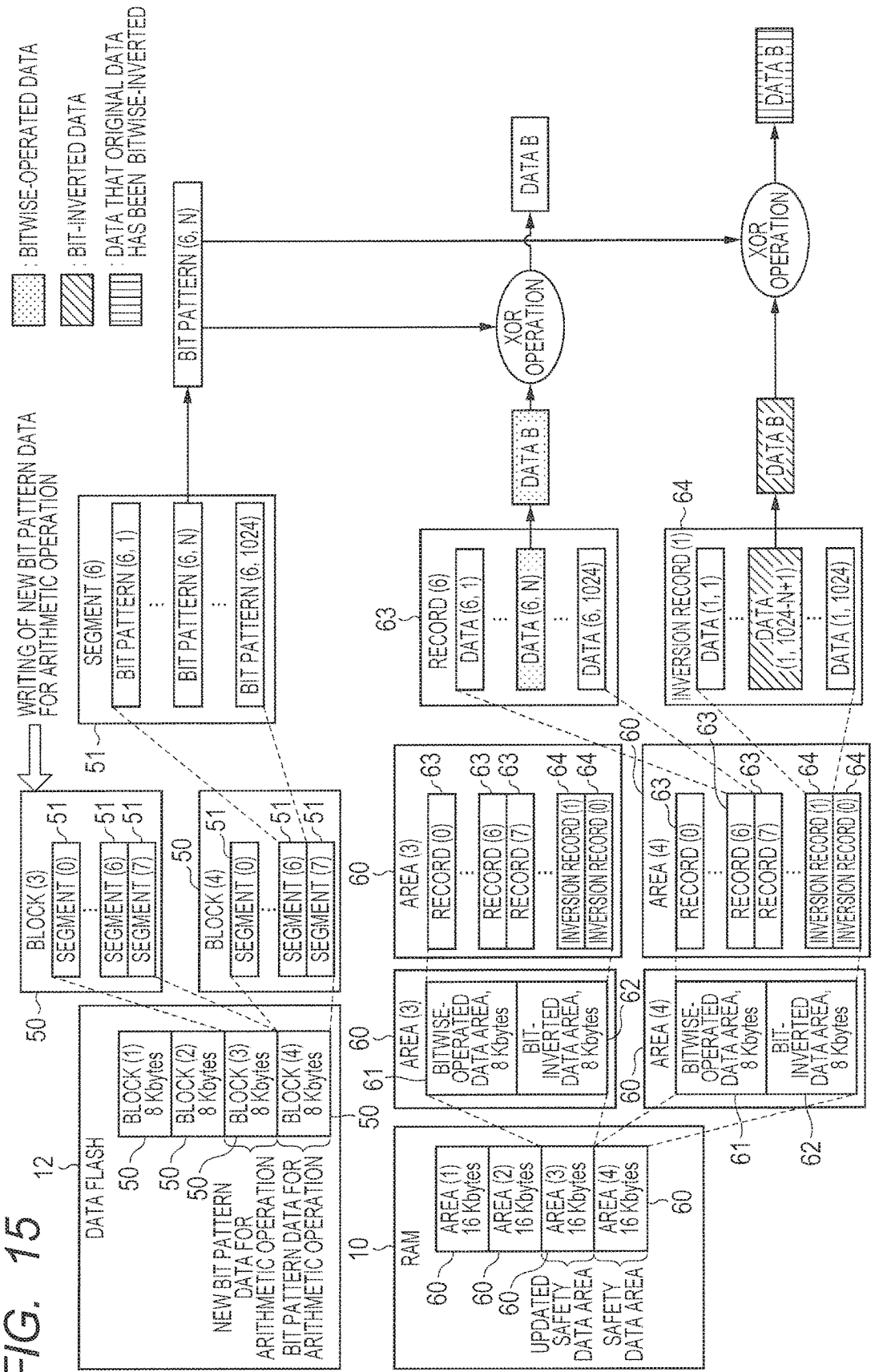
FIG. 15 is a schematic diagram illustrating one example of a relation between a storage area of the semiconductor device according to the fourth embodiment and a saving operation of an update unit of the semiconductor device.
Figure 16:
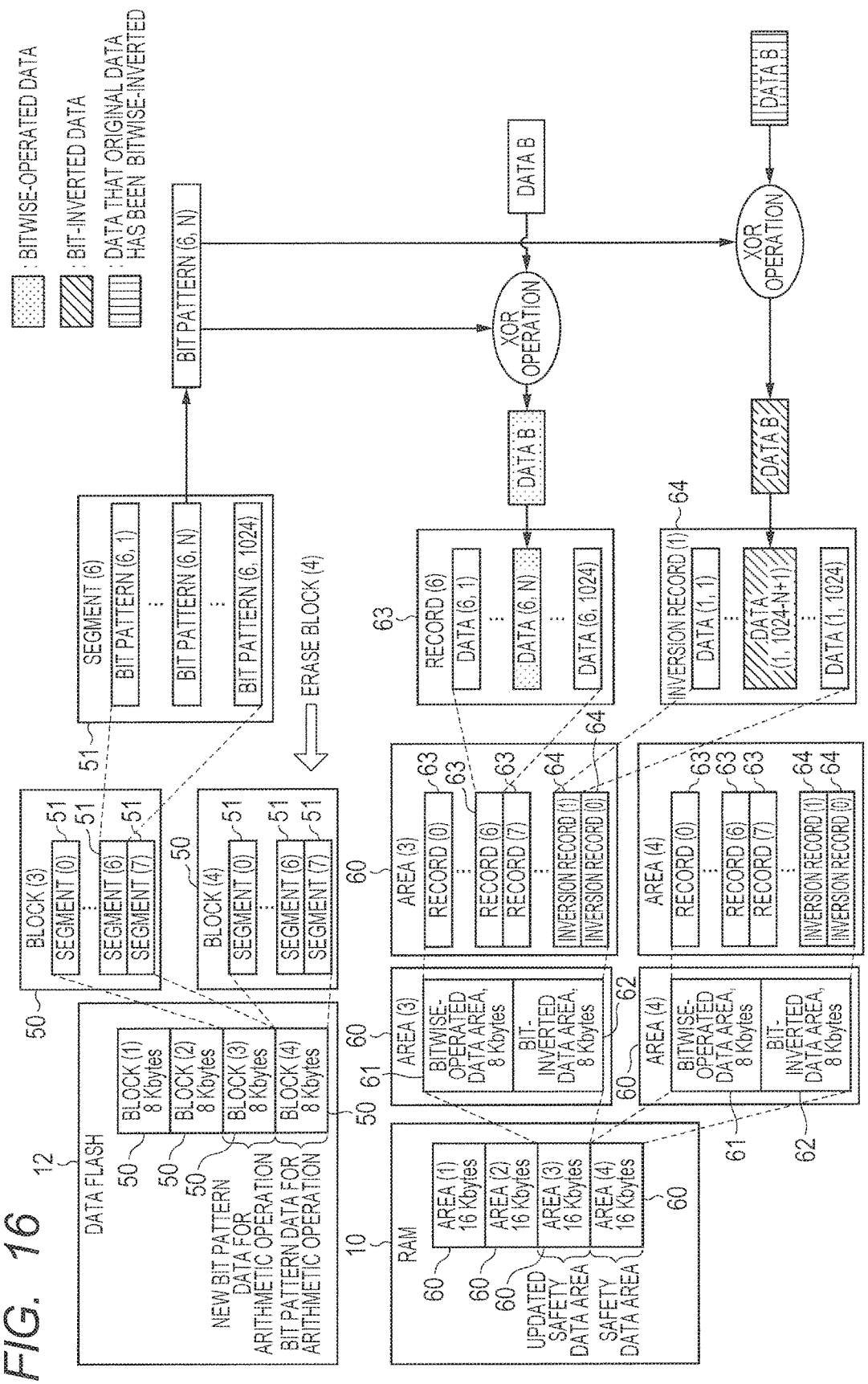
FIG. 16 is a schematic diagram illustrating one example of a relation between the storage area of the semi conductor device according to the fourth embodiment and a restoring operation of the update unit of the semiconductor device.

In the following, the semiconductor device 4 will be described in more detail with reference to FIG. 15 and FIG. 16. FIG. 15 is a schematic diagram, illustrating one example of a relation between the storage areas of the semiconductor device 4 and a saving operation of the update unit 105 of the semiconductor device 4. In addition, FIG. 16 is a schematic diagram illustrating one example of a relation between the storage areas of the semiconductor device 4 and a restoring operation of the update unit 105 of the semiconductor device 4. Incidentally, in the following, description of parts that overlap those of the configurations of the data flash 12 and the RAM 10 illustrated, in FIG. 4 is omitted.

In the fourth embodiment, in the data flash 12, the block 50 that corresponds to the storage area for storing new bit pattern data for arithmetic operation that is the updated bit pattern data for arithmetic operation is surely acquired. Specifically, for example, as illustrated in FIG. 15 and FIG. 16, the block (3) is used as the storage area for storing the updated bit pattern data for arithmetic operation. The bit pattern data for arithmetic operation obtained before updating is stored in the block (4).

Likewise, in the RAM 10, the area 60 that corresponds to the storage area for storing the updated bitwise-operated data and bit-inverted data is surely acquired. Specifically, for example, as illustrated in FIG. 15 and FIG. 16, the area (3) is used as the storage area for storing the updated safety data (the bitwise-operated data and the bit-inverted data). Incidentally, the bitwise-operated data and the bit-inverted data that configure the safety data are stored in at least part of the area (4).

In updating, first, the update unit 105 generates new bit pattern data for arithmetic operation. Then, the update unit 105 writes the new bit pattern data for arithmetic operation into the data flash 12. Specifically, the update unit 105 writes the new bit pattern data for arithmetic operation into the block (3).

Then, the update unit 105 performs the saving operation. That is, the update unit 105 controls so as to read the safety data out of the RAM 10 and save the safety data (see FIG. 15). Specifically, for example, when 1-byte bitwise-operated data (here, it is assumed to be the bitwise-operated data of the data B) is present in the N-th (N=1, 2, . . . , and 1024) storage area of the record (6) of the area (4), the update unit 105 reads out the bitwise-operated data of the data B. Then, the bitwise operation unit 100 performs the bitwise operation on the read-out bitwise-operated data of the data B and the bit pattern data for arithmetic operation that is present in the N-th storage area of the segment (6) of the block (4) and converts the data into the original data of the data B. In addition, the update unit 105 reads the bit-inverted data that is data of the form that each bit of the bitwise-operated data of the data B has been inverted out of the (1024−(N−1))-th storage area of the inversion record (1) of the area (4) that is addressed in reverse order. Then, the bitwise operation unit 100 performs the bitwise operation on the read-out bit-inverted data and the bit pattern data for arithmetic operation that is present in the N-th storage area of the segment (6) of the block (4) and converts the data into data of the form that each bit of the original data of the data B has been inverted.

Incidentally, in saving the safety data, detection as to whether the soft error has occurred may be performed by decision of the data performed by the decision unit 103.

The update unit 105 performs the restoring operation after the saving operation has been performed. That is, the update unit 105 controls so as to restore the safety data by writing the safety data into the RAM 10 (see FIG. 16). Specifically, first, the bitwise operation unit 100 performs the bitwise operation (the XOR operation) on the original data of the data B that has been obtained by performing the saving operation and the bit pattern data for arithmetic operation that is present in the N-th storage area of the segment (6) of the block (3) for storing the new bit pattern data for arithmetic operation. Then, the update unit 105 writes data indicating a result of the XOR operation so performed into the N-th storage area of the record (6) of the area (3). In addition, the bitwise operation unit 100 performs the bitwise operation (the XOR operation) on the data of the form that each bit of the original data of the data B obtained by the saving operation has been inverted and the bit pattern data for arithmetic operation that is present in the N-th storage area of the segment (6) of the block (3). Then, the update unit 105 writes data indicating a result of the XOR operation so performed into the (1024−(N−1))-th storage area of the inversion record (1) of the area (3) that is addressed in reverse order.

The update unit 105 repeats the saving operation and the restoring operation by the number of pieces of data written into the area (4). Then, the update unit 105 erases the content of the block (4) and thereby erases the bit pattern data for arithmetic operation obtained before updating.

Incidentally, in the examples illustrated in FIG. 15 and FIG. 16, in saving the safety data, the above-mentioned saving operation is also performed on the bit-inverted data that is stored in the bit-inverted data area 62, and in restoring the safety data, the XOR operation is performed on the saved bit-inverted data. However, in saving and restoring the safety data, it is allowable that the bitwise-operated data and the bit-inverted data that are based on the bit pattern data for arithmetic operation obtained before updating be only updated to the bitwise-operated data and the bit-inverted data that are based on the bit pattern data for arithmetic operation obtained after updating, and therefore other methods may be adopted. For example, in saving the safety data, the above-mentioned saving operation may be performed only on the bitwise-operated data that is stored in the bitwise-operated data area 61, and in restoring the safety data, the bitwise-operated data obtained by performing bit inversion on the bitwise-operated data on which the above-mentioned restoring operation has been performed may be stored.

Figure 17:
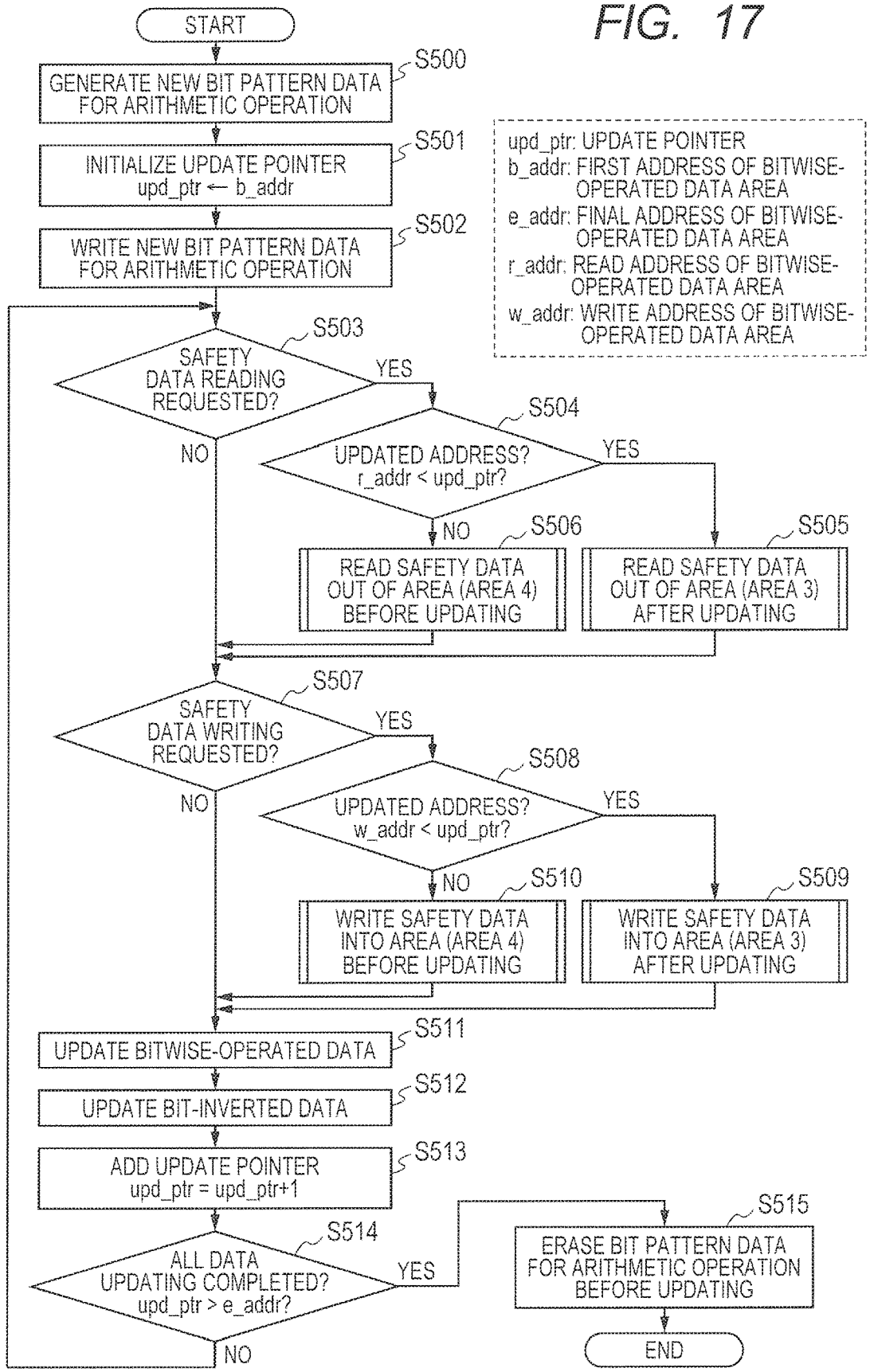
FIG. 17 is a flowchart illustrating one example of an updating operation in the semiconductor device according to the fourth embodiment.

Next, the updating operation will be described along a flowchart. FIG. 17 is a flowchart illustrating one example of the updating operation in the semiconductor device 4. Incidentally, here, an operation flow when safety data reading and/or writing are/is performed while the safety data saving and restoring operations are being performed by updating the bit pattern data for arithmetic operation is illustrated by way of example. While the safety data is being saved and restored, data reading and writing in response to a request from the application, that is, safety data reading and writing other than data reading and writing involved in updating may be inhibited. However, here, an operational example that safety data reading and writing to be performed byte by byte in response to the request from the application are made possible is illustrated.

Here, "upd_ptr" is defined as an update pointer indicating an address to be updated next. That is, "upd_ptr" indicates the address of the safety data that is stored in the area (4) so as to be saved and restored next, "b_addr" is defined as the first address of the bitwise-operated data area 61 of the area (4). In addition, "e_addr" is defined as the final address of the bitwise-operated data area 61 of the area (4). Then, "r_addr" is defined as the read address of the bitwise-operated data area 61 of the area (4) that is instructed by the read request from the safety application. In addition, "w_addr" is defined as the write address of the bitwise-operated data area 61 of the area (4) that is instructed by the write request from the safety application.

In step 500 (S500), the update unit 105 generates new bit pattern data for arithmetic operation.

In step 501 (S501), the update unit 105 initializes the update pointer to the first address of the bitwise-operated data area 61 (upd_ptr←b_addr).

In step 502 (S502), the update unit 105 writes the new bit pattern data for arithmetic operation into the data flash 12.

Specifically, the update unit 105 writes the new bit pattern data for arithmetic operation into the block (3). Incidentally, in writing the bit pattern data for arithmetic operation, the processes in step S101 to step S103 illustrated in FIG. 5 may be performed.

In step 503 (S503), the storage control unit 102 decides whether a safety data read request is made. When the safety data read request is made, the process shifts to step 504. While, when the safety data read request is not made, the process shifts to step 507.

In step 504 (S504), the storage control unit 102 decides whether the read address is an updated (saved and restored) address (r_addr<upd_ptr?). When the read address is the updated address, in step 505 (S505), the storage control unit 102 reads the safety data out of the area (3) that is the area that the data obtained after updating is stored. Specifically, the processes in step S301 to step S308 illustrated in FIG. 7 are performed. When the read address is the address obtained before updating, in step 506 (S506), the storage control unit 102 reads the safety data out of the area (4) that is the area that the data obtained before updating is stored. Specifically, the processes in step S301 to step S308 illustrated in FIG. 7 are performed.

In step 507 (S507), the storage control unit 102 decides whether a safety data write request is made. When the safety data write request is made, the process shifts to step 508. While, when the safety data write request is not made, the process shifts to step 511.

In step 508 (S508), the storage control unit 102 decides whether the write address is the updated (saved and restored) address (w_addr<upt_ptr?). When the write address is the updated address, in step 509 (S509), the storage control unit 102 writes the safety data into the area (3) that is the area that the data obtained after updating is stored. Specifically, the processes in step S201 to step S206 illustrated in FIG. 6 are performed. When the write address is the address before updating, in step 510 (S510), the storage control unit 102 writes the safety data into the area (4) that is the area that the data obtained before updating is stored. Specifically, the processes in step S201 to step S206 illustrated in FIG. 6 are performed.

In step 511 (S511), the update unit 105 updates the bitwise-operated data. That is, the update unit 105 saves the bitwise-operated data of the address that the update pointer indicates from the area (4) and restores the bitwise-operated data so saved into the area (3). In addition, in step 512 (S512), the update unit 105 updates the bit-inverted data. That is, the update unit 105 saves the bit-inverted data of the address that the update pointer indicates from the area (4) and restores the bit-inverted data so saved into the area (3).

In step 513 (S513), the update unit 105 increments the update pointer by one (upd_ptr=upd_ptr+1).

In step 514 (S514), the update unit 105 decides whether updating of all pieces of the data in the area (4) has been completed (upd_ptr>e_addr?). When updating of all pieces of the data is not completed, the process returns to step 503. When updating of all pieces of the data has been completed, in step 515 (S515), the update unit 105 erases the bit pattern data for arithmetic operation obtained before updating that is present in the block (4).

As described above, according to the semiconductor device 4 according to the fourth embodiment, it is possible to update the bit pattern data for arithmetic operation. Thereby, even if the data of the same content maybe written into the same address, it is possible to suppress the deviation of the data. In addition, since the safety data read destination and/or write destination are/is changed in accordance with the progress of updating, it is possible to perform data reading and writing even while updating is being performed. Incidentally, it is possible to combine the updating operation described in the fourth embodiment with the operations in the above-mentioned second and/or the third embodiment.

<Fifth Embodiment>

Next, the fifth embodiment will be described. In each of the above-mentioned embodiments, the bitwise operation unit 100 uses the bit pattern data for arithmetic operation that is stored in the data flash 12. On the other hand, in the fifth embodiment, the address of the RAM 10 that is the safety data storage destination is used. Incidentally, since the semiconductor device according to the fifth embodiment is the same as the semiconductor device 1 in other points, description thereof is omitted.

In the fifth embodiment, the bitwise operation unit 100 performs the bitwise operation by using the sequential data that has been generated by using the value of the address of the bitwise-operated data storage destination as the bit pattern data for arithmetic operation. 18. Incidentally, description will be made on the assumption that the configuration of the RAM 10 is the same as the configuration illustrated in FIG. 4. Accordingly, also in the example illustrated in FIG. 18, the area (4) of the RAM 10 is the safety data area that the safety data is stored. Here, it is assumed that the address of the RAM 10 is started with the 0-th and the first address of the area (4) of the RAM 10 is "0x0000C000".

Figure 18:
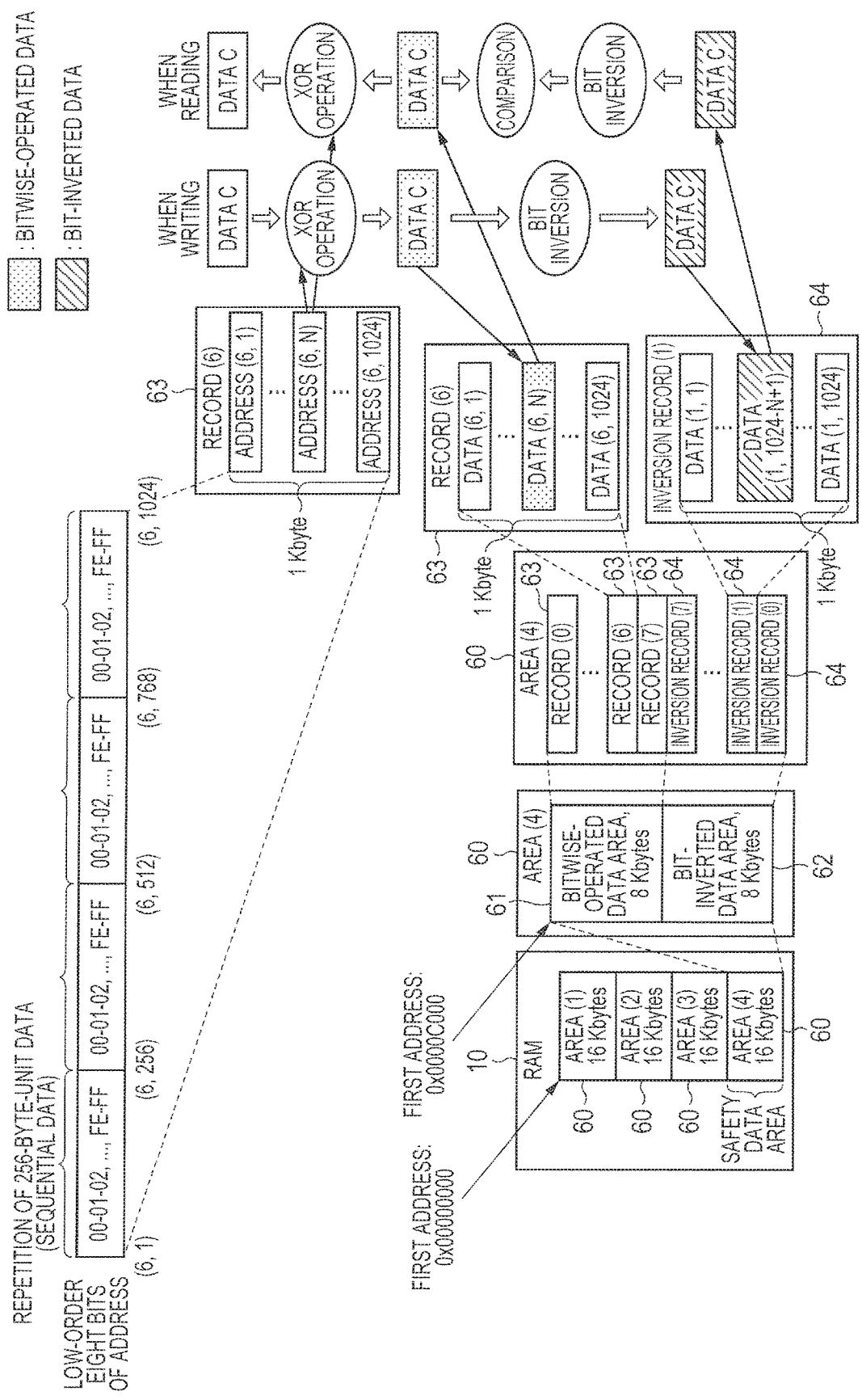
FIG. 18 is a schematic diagram illustrating one example of a relation between a storage area of a semiconductor device according to a fifth embodiment and an operation of the semiconductor device.

When the storage control unit 102 writes the data (the data C in FIG. 18) that is the safety data into the N-th (N=1, 2, ..., and 1024) 1-byte area of the record (6) that has been divided into parts as illustrated in FIG. 18, the bitwise operation unit 100 performs the XOR operation on the data C and a low-order 8-bit part of the N-th address of the record (6), and the storage control unit 102 writes bitwise-operated data that is a result of the XOR operation so performed into the N-th 1-byte area. In addition, the storage control unit 102 writes bit-inverted data that has been generated by the bit inversion unit 101 into the (1024−(N−1))-th area of the inversion recode (1) that is addressed in reverse order.

When the low-order 8-bit part of the first address of the area (4) is "0x00", the bit pattern data for arithmetic operation has the sequential data content that pieces of the data 0x00 to 0xFF are repeated in units of 256 bytes. Accordingly, the deviation of the user application data is improved.

When the data C that is written into the RAM 10 is to be read out, the storage control unit 102 reads the bitwise-operated data out of the N-th area of the record (6) and reads the bit-inverted data out of the (1024−(N−1))-th area of the inversion record (1). Then, the bit inversion unit 101 inverts each bit of the bit-inverted data. The decision unit 103 compares the read-out bitwise-operated data with the data that has been inverted bit by bit by the bit inversion unit 101. Then, when the contents of these pieces of data do not mutually match, the decision unit 103 decides that the soft error has occurred. When the contents of these pieces of data mutually match in decision performed by the decision unit 103, the bitwise operation unit 100 performs the XOR operation on the read-out bitwise-operated data and the low-order 8-bit part of the N-th address of the record (6) and restores the data.

Incidentally, as for the concrete operation flow, an operation of extracting the low-order 8-bit part from the storage destination address of the area (4) may be performed, in place of calculations of the storage destination address of the bit pattern data for arithmetic operation in step 202 illustrated in FIG. 6 and step 302 illustrated in FIG. 7.

As described above, according to the fifth embodiment, also in the semiconductor device with no data flash, conversion into the data that the number of "1s" and the number of "0s" are almost the same as each other becomes possible and it is possible to skip writing or updating of the bit pattern data for arithmetic operation. Incidentally, it goes without saying that the fifth embodiment is also applicable to the second and third embodiments.

Although in the foregoing, the invention that has been made by the inventors and others has been specifically described on the basis of the preferred embodiments of the present invention, it goes without saying that the present invention is not limited to the above-mentioned embodiments and may be altered and modified in a variety of ways within the range not deviating from the gist of the present invention. For example, a nonvolatile memory such as an EFPROM (Electrically Erasable Programmable Read-Only Memory) and so forth may be used in place of the data flash. In addition, the nonvolatile memory may not be built in the semiconductor device and may be provided externally. In addition, the bitwise operation unit 100 may simply generate the data of the bit pattern that the number of "1s" and the number of "0s" are almost the same as each other and an optional bitwise operation other than the XOR operation may be used.

What is claimed is:

1. A semiconductor device, comprising:
    a bitwise operation unit that is implemented by a processor and that performs a first bitwise operation on first n-bit (n is an integer) data and second data of an n-bit first bit pattern to generate third data having a second bit pattern within which a number of "1s" and a number of "0s" are substantially the same as each other, wherein the first n-bit data is included in storage object data; and
    a storage control unit that is implemented by the processor and that stores the third data into a first storage destination of a storage unit and stores fourth data into a second storage destination of the storage unit, wherein the fourth data is generated by performing a second bitwise operation on the third data stored in the first storage destination of the storage unit, the fourth data matching the third data or data that is convertible into the third data if a soft error does not occur in the third data stored in the first storage destination of the storage unit.

2. The semiconductor device according to claim 1, further comprising:
    a bit inversion unit that generates the fourth data by inverting each bit of the third data,
    wherein the storage control unit stores the third data and the fourth data that has been generated by the bit inversion unit respectively into the storage unit.

3. The semiconductor device according to claim 1, wherein the bitwise operation unit uses the second data that has been selected from among a plurality of different pieces of second data based on the first storage destination of the third data in the first bitwise operation.

4. The semiconductor device according to claim 1, further comprising:
    a decision unit that is implemented by the processor and that decides whether contents of the data stored in the first storage destination and the data stored in the second storage destination mutually match.

5. The semiconductor device according to claim 1,
wherein the storage unit includes a built-in storage unit that is built in the semiconductor device and an external storage unit that is coupled to the semiconductor device, and
wherein the storage control unit stores one of the third data and the fourth data into the built-in storage unit and stores the other of the third data and the fourth data into the external storage unit.

6. The semiconductor device according to claim 1, further comprising:
an update unit that is implemented by the processor and that updates the second data and updates the third data and the fourth data that are based on the second data obtained before updating respectively the third data and the fourth data that are based on the updated second data.

7. The semiconductor device according to claim 6,
wherein the update unit updates in order a plurality of pieces of the third data and a plurality of pieces of the fourth data, by replacing the storage destinations of the third data and the fourth data obtained before updating with storage destinations of the third data and the fourth data obtained after updating, and
wherein the storage control unit further controls reading of the data stored in the storage unit and changes read destinations and/or write destinations of the third data and the fourth data in accordance with the progress of updating by the update unit.

8. The semiconductor device according to claim 1,
wherein the second data is random data, and
wherein the first bitwise operation is an exclusive OR operation.

9. The semiconductor device according to claim 1,
wherein the second data is sequential data that is configured by arraying a plurality of continuous values in ascending order or descending order, and
wherein the first bitwise operation is an exclusive OR operation.

10. The semiconductor device according to claim 9,
wherein the second data is the sequential data that has been generated by using a value of an address of the first storage destination.

11. A functional safety system, comprising:
a first semiconductor device; and
a second semiconductor device,
wherein the first semiconductor device and the second semiconductor device each includes
a storage unit,
a bitwise operation unit that is implemented by a processor and that performs a first bitwise operation on first n-bit (n is an integer) data that is included in storage object data and second data having an n-bit first bit pattern to generate third data having a second bit pattern within which a number of "1s" and a number of "0s" are substantially the same as each other, a storage control unit that is implemented by the processor and that stores the third data into a first storage destination of the storage unit and stores fourth data into a second storage destination of the storage unit, wherein the fourth data is generated by performing a second bitwise operation on the third data stored in the first storage destination of the storage unit, the fourth data matching the third data or data that is convertible into the third data if a soft error does not occur in the third data stored in the first storage destination of the storage unit; and a processing unit that is implemented by the processor and that performs a process that has been determined in advance by using the data stored in the storage unit, and wherein at least the first semiconductor device further includes a process control unit that is implemented by the processor and that compares a result of a process performed by the processing unit of the first semiconductor device with a result of a process performed by the processing unit of the second semiconductor device.

12. A semiconductor device, comprising:

a bit pattern storage unit having stored therein a bit pattern having substantially the same number of "1s" as "0s";

a bitwise operation unit implemented by a processor and configured to perform a first bitwise operation on data to be written and the bit pattern to produce a bitwise-operated data;

a bit inversion unit configured to invert the bitwise-operated data;

a data storage unit configured to store the bitwise-operated data and the inverted bitwise-operated data;

a decision unit implemented by a processor configured to invert the read bitwise-operated data, compare the inverted read bitwise-operated data with the inverted bitwise operated data stored in the data storage unit, and indicate a soft error if the comparison does not indicate a match.

* * * * *